(12) United States Patent
Gladwin et al.

(10) Patent No.: US 8,756,480 B2
(45) Date of Patent: Jun. 17, 2014

(54) PRIORITIZED DELETING OF SLICES STORED IN A DISPERSED STORAGE NETWORK

(75) Inventors: S. Christopher Gladwin, Chicago, IL (US); Thomas F. Shirley, Jr., Wauwatosa, WI (US); Jason K. Resch, Chicago, IL (US)

(73) Assignee: Cleversafe, Inc., Chicago, IL (US)

( * ) Notice: Subject to any disclaimer, the term of this patent is extended or adjusted under 35 U.S.C. 154(b) by 127 days.

(21) Appl. No.: 13/464,846

(22) Filed: May 4, 2012

(65) Prior Publication Data
US 2012/0311403 A1    Dec. 6, 2012

Related U.S. Application Data

(60) Provisional application No. 61/493,825, filed on Jun. 6, 2011.

(51) Int. Cl.
| G11C 29/00 | (2006.01) |
| G06F 11/10 | (2006.01) |
| G06F 3/06 | (2006.01) |
| H04N 21/858 | (2011.01) |

(52) U.S. Cl.
CPC ............ *G06F 11/108* (2013.01); *G06F 3/0652* (2013.01); *H04N 21/8586* (2013.01); *G06F 2211/1035* (2013.01)
USPC ........... 714/763; 714/766; 714/751; 714/752; 714/764; 714/770; 714/773; 365/185.09

(58) Field of Classification Search
CPC ............ G06F 221/1035; G06F 11/108; G06F 3/0652; G06F 3/0653; H04N 21/8586
See application file for complete search history.

(56) References Cited

U.S. PATENT DOCUMENTS

| 4,092,732 A | 5/1978 | Ouchi |
| 5,454,101 A | 9/1995 | Mackay et al. |
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |

(Continued)

OTHER PUBLICATIONS

Shamir; How to Share a Secret; Communications of the ACM; vol. 22, No. 11; Nov. 1979; pp. 612-613.

(Continued)

*Primary Examiner* — John Trimmings
(74) *Attorney, Agent, or Firm* — Garlick & Markison; Timothy W. Markison

(57) ABSTRACT

A method begins by a dispersed storage (DS) processing module monitoring storage of data, wherein the data is encoded using a dispersed storage error coding function to produce a plurality of sets of encoded data slices and is stored as the plurality of sets of encoded data slices. The method continues with the DS processing module determining analysis priority of the data in accordance with an analysis prioritization protocol. When the analysis priority of the data compares unfavorably to a first priority threshold, the method continues with the DS processing module issuing a command to delete an encoded data slice from each set of at least some of the plurality of sets of encoded data slices.

14 Claims, 19 Drawing Sheets

(56) References Cited

U.S. PATENT DOCUMENTS

| | | | |
|---|---|---|---|
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 8,438,456 | B2 * | 5/2013 | Grube et al. ............... 714/770 |
| 8,489,915 | B2 * | 7/2013 | Dhuse et al. ............... 714/6.22 |
| 8,527,838 | B2 * | 9/2013 | Grube et al. ............... 714/764 |
| 8,533,256 | B2 * | 9/2013 | Baptist et al. ............... 709/203 |
| 2001/0048662 | A1 * | 12/2001 | Suzuki et al. ............... 370/230 |
| 2002/0049947 | A1 * | 4/2002 | Sridharan et al. ........... 714/752 |
| 2002/0062422 | A1 | 5/2002 | Butterworth et al. |
| 2002/0166079 | A1 * | 11/2002 | Ulrich et al. ............... 714/6 |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma et al. |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula, Jr. |
| 2005/0132070 | A1 | 6/2005 | Redlich et al. |
| 2005/0144382 | A1 | 6/2005 | Schmisseur |
| 2005/0229069 | A1 | 10/2005 | Hassner |
| 2006/0047907 | A1 | 3/2006 | Shiga et al. |
| 2006/0136448 | A1 | 6/2006 | Cialini et al. |
| 2006/0156059 | A1 * | 7/2006 | Kitamura ............... 714/6 |
| 2006/0224603 | A1 | 10/2006 | Correll, Jr. |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters, III et al. |
| 2009/0094251 | A1 | 4/2009 | Gladwin et al. |
| 2009/0094318 | A1 * | 4/2009 | Gladwin et al. ............... 709/203 |
| 2010/0023524 | A1 | 1/2010 | Gladwin et al. |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68, Nov. 6, 2013.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

\* cited by examiner

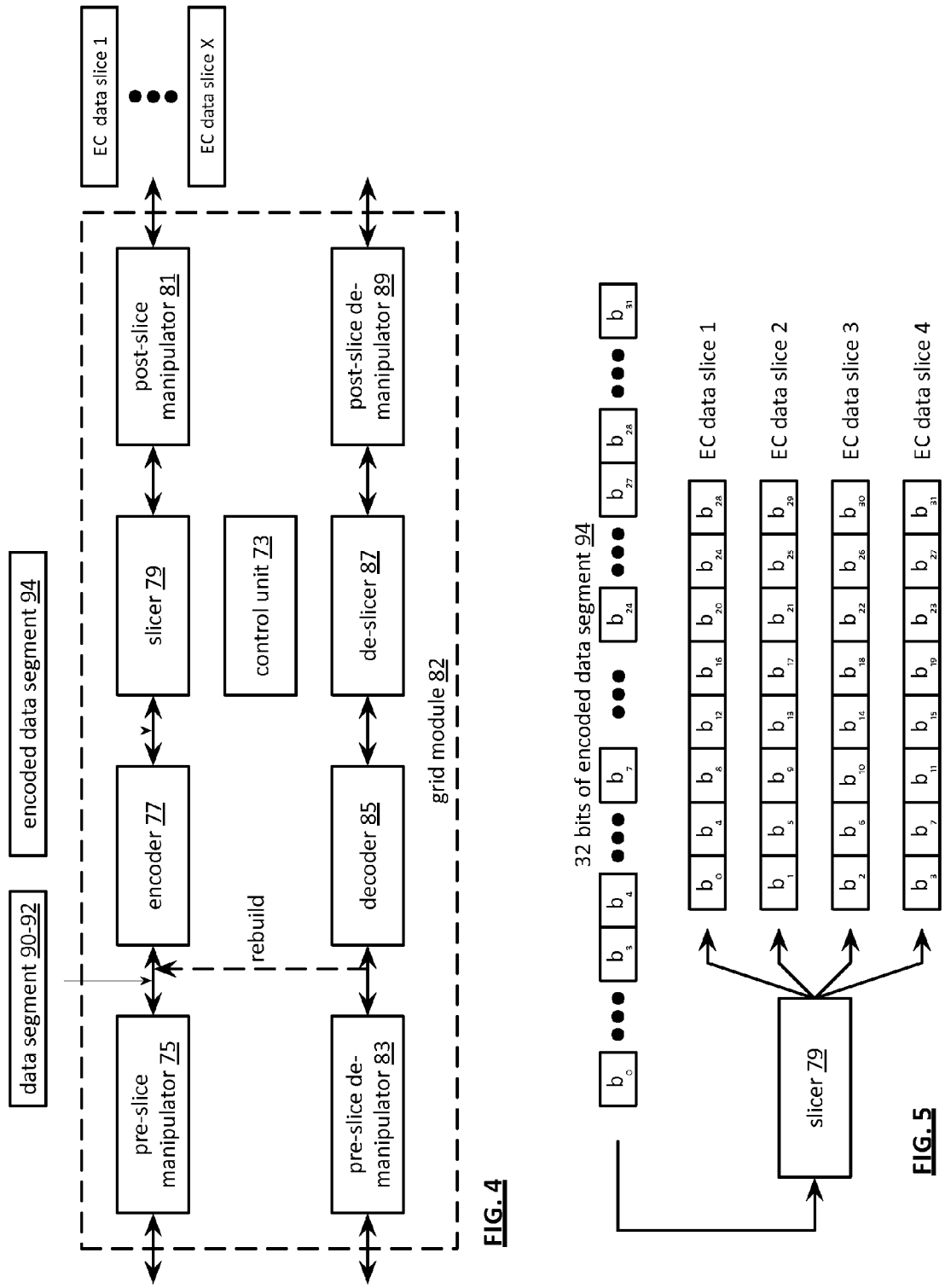

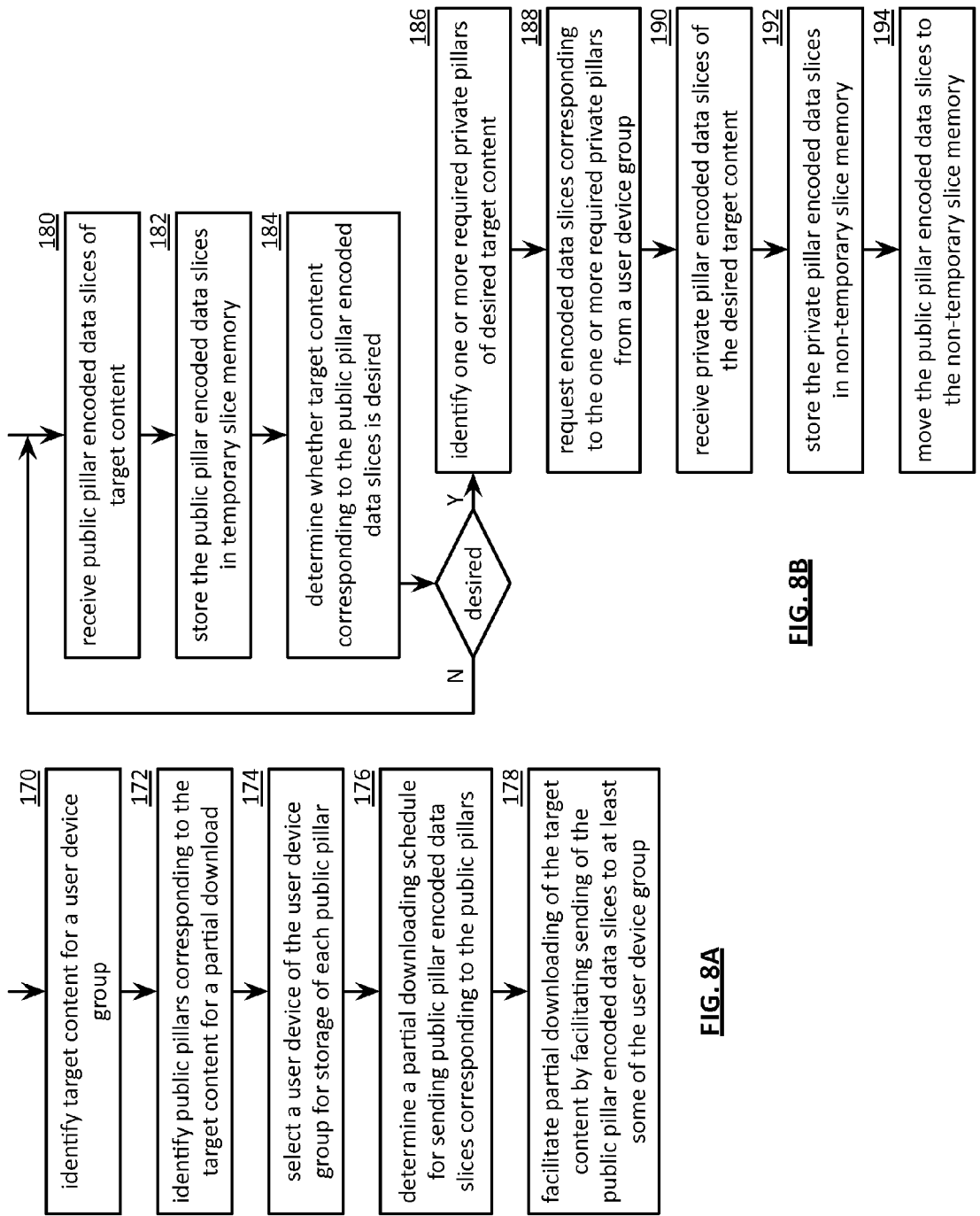

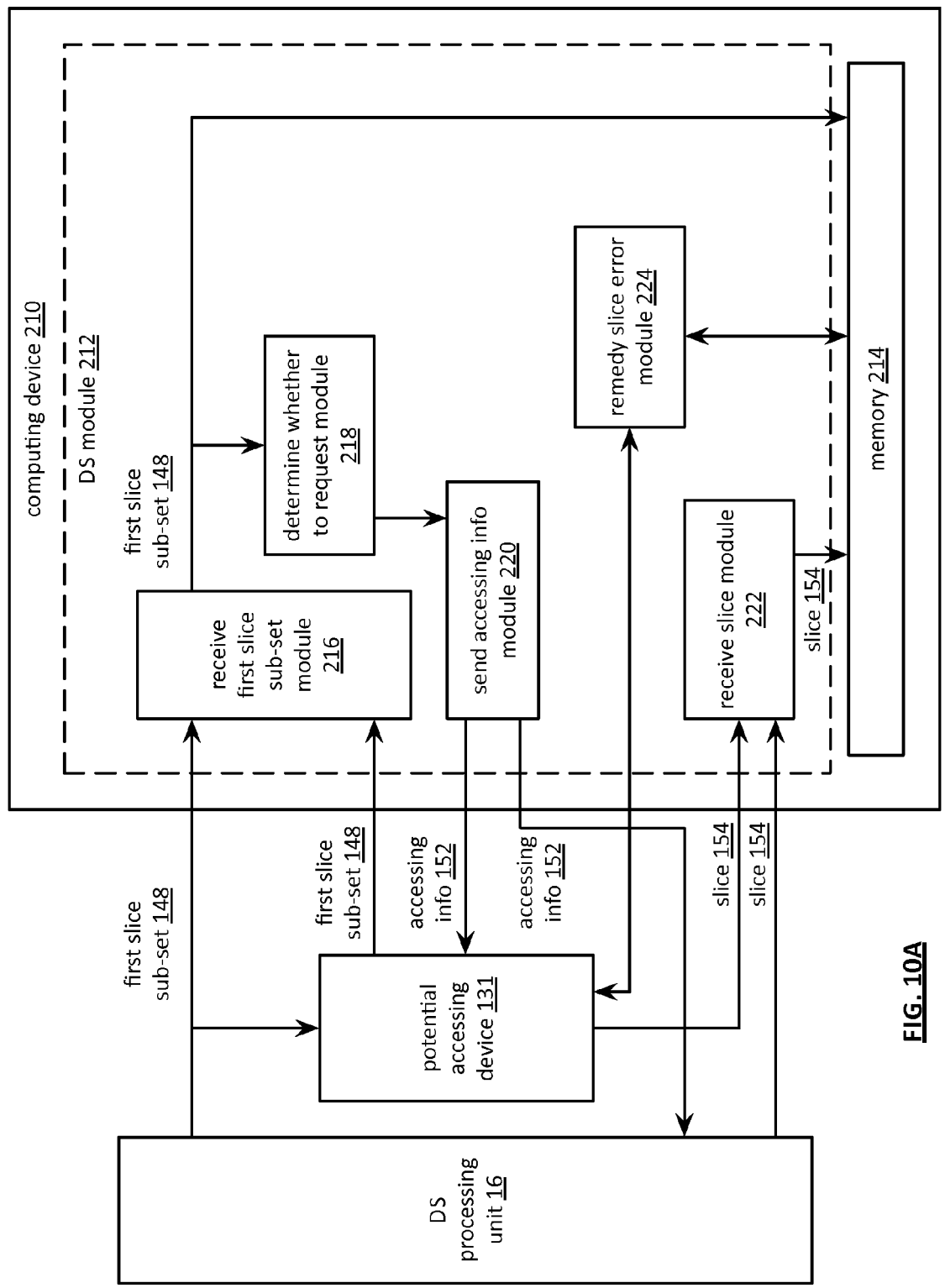

PRIORITIZED DELETING OF SLICES STORED IN A DISPERSED STORAGE NETWORK

CROSS REFERENCE TO RELATED PATENTS

The present U.S. Utility Patent Application claims priority pursuant to 35 U.S.C. §119(e) to U.S. Provisional Application No. 61/493,825, entitled "Accessing Data in a Dispersed Storage Network," filed Jun. 6, 2011, pending, which is incorporated herein by reference in its entirety and made part of the present U.S. Utility Patent Application for all purposes.

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

1. Technical Field of the Invention

This invention relates generally to computing systems and more particularly to data storage solutions within such computing systems.

2. Description of Related Art

Computers are known to communicate, process, and store data. Such computers range from wireless smart phones to data centers that support millions of web searches, stock trades, or on-line purchases every day. In general, a computing system generates data and/or manipulates data from one form into another. For instance, an image sensor of the computing system generates raw picture data and, using an image compression program (e.g., JPEG, MPEG, etc.), the computing system manipulates the raw picture data into a standardized compressed image.

With continued advances in processing speed and communication speed, computers are capable of processing real time multimedia data for applications ranging from simple voice communications to streaming high definition video. As such, general-purpose information appliances are replacing purpose-built communications devices (e.g., a telephone). For example, smart phones can support telephony communications but they are also capable of text messaging and accessing the internet to perform functions including email, web browsing, remote applications access, and media communications (e.g., telephony voice, image transfer, music files, video files, real time video streaming. etc.).

Each type of computer is constructed and operates in accordance with one or more communication, processing, and storage standards. As a result of standardization and with advances in technology, more and more information content is being converted into digital formats. For example, more digital cameras are now being sold than film cameras, thus producing more digital pictures. As another example, web-based programming is becoming an alternative to over the air television broadcasts and/or cable broadcasts. As further examples, papers, books, video entertainment, home video, etc. are now being stored digitally, which increases the demand on the storage function of computers.

A typical computer storage system includes one or more memory devices aligned with the needs of the various operational aspects of the computer's processing and communication functions. Generally, the immediacy of access dictates what type of memory device is used. For example, random access memory (RAM) memory can be accessed in any random order with a constant response time, thus it is typically used for cache memory and main memory. By contrast, memory device technologies that require physical movement such as magnetic disks, tapes, and optical discs, have a variable response time as the physical movement can take longer than the data transfer, thus they are typically used for secondary memory (e.g., hard drive, backup memory, etc.).

A computer's storage system will be compliant with one or more computer storage standards that include, but are not limited to, network file system (NFS), flash file system (FFS), disk file system (DFS), small computer system interface (SCSI), internet small computer system interface (iSCSI), file transfer protocol (FTP), and web-based distributed authoring and versioning (WebDAV). These standards specify the data storage format (e.g., files, data objects, data blocks, directories, etc.) and interfacing between the computer's processing function and its storage system, which is a primary function of the computer's memory controller.

Despite the standardization of the computer and its storage system, memory devices fail; especially commercial grade memory devices that utilize technologies incorporating physical movement (e.g., a disc drive). For example, it is fairly common for a disc drive to routinely suffer from bit level corruption and to completely fail after three years of use. One solution is to a higher-grade disc drive, which adds significant cost to a computer.

Another solution is to utilize multiple levels of redundant disc drives to replicate the data into two or more copies. One such redundant drive approach is called redundant array of independent discs (RAID). In a RAID device, a RAID controller adds parity data to the original data before storing it across the array. The parity data is calculated from the original data such that the failure of a disc will not result in the loss of the original data. For example, RAID 5 uses three discs to protect data from the failure of a single disc. The parity data, and associated redundancy overhead data, reduces the storage capacity of three independent discs by one third (e.g., n-1=capacity). RAID 6 can recover from a loss of two discs and requires a minimum of four discs with a storage capacity of n-2.

While RAID addresses the memory device failure issue, it is not without its own failures issues that affect its effectiveness, efficiency and security. For instance, as more discs are added to the array, the probability of a disc failure increases, which increases the demand for maintenance. For example, when a disc fails, it needs to be manually replaced before another disc fails and the data stored in the RAID device is lost. To reduce the risk of data loss, data on a RAID device is typically copied on to one or more other RAID devices. While this addresses the loss of data issue, it raises a security issue since multiple copies of data are available, which increases the chances of unauthorized access. Further, as the amount of data being stored grows, the overhead of RAID devices becomes a non-trivial efficiency issue.

BRIEF DESCRIPTION OF THE SEVERAL VIEWS OF THE DRAWING(S)

FIG. 4 is a schematic block diagram of an embodiment of a grid module in accordance with the present invention;

FIG. 5 is a diagram of an example embodiment of error coded data slice creation in accordance with the present invention;

FIG. 8A is a flowchart illustrating another example of facilitating partial content downloading in accordance with the present invention;

FIG. 8B is a flowchart illustrating an example of acquiring multi-media content in accordance with the present invention;

FIG. 10A is a schematic block diagram of another embodiment of a computing system in accordance with the present invention;

DETAILED DESCRIPTION OF THE INVENTION

Figure 1:
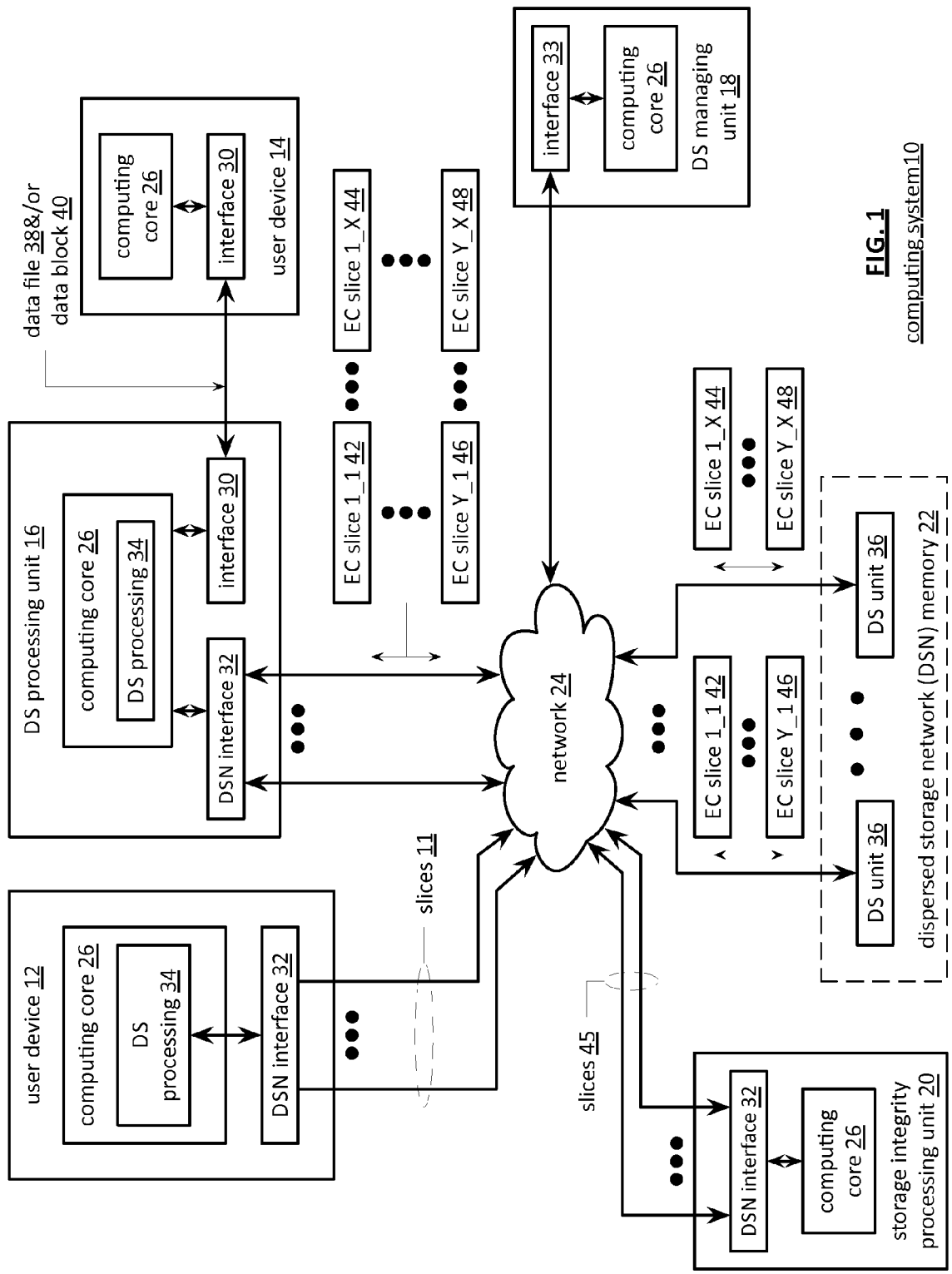
FIG. 1 is a schematic block diagram of an embodiment of a computing system in accordance with the present invention.

FIG. 1 is a schematic block diagram of a computing system 10 that includes one or more of a first type of user devices 12, one or more of a second type of user devices 14, at least one distributed storage (DS) processing unit 16, at least one DS managing unit 18, at least one storage integrity processing unit 20, and a distributed storage network (DSN) memory 22 coupled via a network 24. The network 24 may include one or more wireless and/or wire lined communication systems; one or more private intranet systems and/or public internet systems; and/or one or more local area networks (LAN) and/or wide area networks (WAN).

The DSN memory 22 includes a plurality of distributed storage (DS) units 36 for storing data of the system. Each of the DS units 36 includes a processing module and memory and may be located at a geographically different site than the other DS units (e.g., one in Chicago, one in Milwaukee, etc.).

Each of the user devices 12-14, the DS processing unit 16, the DS managing unit 18, and the storage integrity processing unit 20 may be a portable computing device (e.g., a social networking device, a gaming device, a cell phone, a smart phone, a personal digital assistant, a digital music player, a digital video player, a laptop computer, a handheld computer, a video game controller, and/or any other portable device that includes a computing core) and/or a fixed computing device (e.g., a personal computer, a computer server, a cable set-top box, a satellite receiver, a television set, a printer, a fax machine, home entertainment equipment, a video game console, and/or any type of home or office computing equipment). Such a portable or fixed computing device includes a computing core 26 and one or more interfaces 30, 32, and/or 33. An embodiment of the computing core 26 will be described with reference to FIG. 2.

With respect to the interfaces, each of the interfaces 30, 32, and 33 includes software and/or hardware to support one or more communication links via the network 24 indirectly and/or directly. For example, interfaces 30 support a communication link (wired, wireless, direct, via a LAN, via the network 24, etc.) between the first type of user device 14 and the DS processing unit 16. As another example, DSN interface 32 supports a plurality of communication links via the network 24 between the DSN memory 22 and the DS processing unit 16, the first type of user device 12, and/or the storage integrity processing unit 20. As yet another example, interface 33 supports a communication link between the DS managing unit 18 and any one of the other devices and/or units 12, 14, 16, 20, and/or 22 via the network 24.

In general and with respect to data storage, the system 10 supports three primary functions: distributed network data storage management, distributed data storage and retrieval, and data storage integrity verification. In accordance with these three primary functions, data can be distributedly stored in a plurality of physically different locations and subsequently retrieved in a reliable and secure manner regardless of failures of individual storage devices, failures of network equipment, the duration of storage, the amount of data being stored, attempts at hacking the data, etc.

The DS managing unit 18 performs distributed network data storage management functions, which include establishing distributed data storage parameters, performing network operations, performing network administration, and/or performing network maintenance. The DS managing unit 18 establishes the distributed data storage parameters (e.g., allocation of virtual DSN memory space, distributed storage parameters, security parameters, billing information, user profile information, etc.) for one or more of the user devices 12-14 (e.g., established for individual devices, established for a user group of devices, established for public access by the user devices, etc.). For example, the DS managing unit 18 coordinates the creation of a vault (e.g., a virtual memory block) within the DSN memory 22 for a user device (for a group of devices, or for public access). The DS managing unit 18 also determines the distributed data storage parameters for the vault. In particular, the DS managing unit 18 determines a number of slices (e.g., the number that a data segment of a data file and/or data block is partitioned into for distributed storage) and a read threshold value (e.g., the minimum number of slices required to reconstruct the data segment).

As another example, the DS managing module 18 creates and stores, locally or within the DSN memory 22, user profile information. The user profile information includes one or more of authentication information, permissions, and/or the security parameters. The security parameters may include one or more of encryption/decryption scheme, one or more encryption keys, key generation scheme, and data encoding/decoding scheme.

As yet another example, the DS managing unit 18 creates billing information for a particular user, user group, vault access, public vault access, etc. For instance, the DS managing unit 18 tracks the number of times user accesses a private vault and/or public vaults, which can be used to generate a per-access bill. In another instance, the DS managing unit 18 tracks the amount of data stored and/or retrieved by a user device and/or a user group, which can be used to generate a per-data-amount bill.

The DS managing unit 18 also performs network operations, network administration, and/or network maintenance. As at least part of performing the network operations and/or administration, the DS managing unit 18 monitors performance of the devices and/or units of the system 10 for potential failures, determines the devices and/or unit's activation status, determines the devices' and/or units' loading, and any other system level operation that affects the performance level of the system 10. For example, the DS managing unit 18 receives and aggregates network management alarms, alerts, errors, status information, performance information, and messages from the devices 12-14 and/or the units 16, 20, 22. For example, the DS managing unit 18 receives a simple network management protocol (SNMP) message regarding the status of the DS processing unit 16.

The DS managing unit 18 performs the network maintenance by identifying equipment within the system 10 that needs replacing, upgrading, repairing, and/or expanding. For example, the DS managing unit 18 determines that the DSN memory 22 needs more DS units 36 or that one or more of the DS units 36 needs updating.

The second primary function (i.e., distributed data storage and retrieval) begins and ends with a user device 12-14. For instance, if a second type of user device 14 has a data file 38 and/or data block 40 to store in the DSN memory 22, it send the data file 38 and/or data block 40 to the DS processing unit 16 via its interface 30. As will be described in greater detail with reference to FIG. 2, the interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data file 38 and/or data block 40.

The DS processing unit 16 receives the data file 38 and/or data block 40 via its interface 30 and performs a distributed storage (DS) process 34 thereon (e.g., an error coding dispersal storage function). The DS processing 34 begins by partitioning the data file 38 and/or data block 40 into one or more data segments, which is represented as Y data segments. For example, the DS processing 34 may partition the data file 38 and/or data block 40 into a fixed byte size segment (e.g., $2^1$ to $2^n$ bytes, where n=>2) or a variable byte size (e.g., change byte size from segment to segment, or from groups of segments to groups of segments, etc.).

For each of the Y data segments, the DS processing 34 error encodes (e.g., forward error correction (FEC), information dispersal algorithm, or error correction coding) and slices (or slices then error encodes) the data segment into a plurality of error coded (EC) data slices 42-48, which is represented as X slices per data segment. The number of slices (X) per segment, which corresponds to a number of pillars n, is set in accordance with the distributed data storage parameters and the error coding scheme. For example, if a Reed-Solomon (or other FEC scheme) is used in an n/k system, then a data segment is divided into n slices, where k number of slices is needed to reconstruct the original data (i.e., k is the threshold). As a few specific examples, the n/k factor may be 5/3; 6/4; 8/6; 8/5; 16/10.

For each slice 42-48, the DS processing unit 16 creates a unique slice name and appends it to the corresponding slice 42-48. The slice name includes universal DSN memory addressing routing information (e.g., virtual memory addresses in the DSN memory 22) and user-specific information (e.g., user ID, file name, data block identifier, etc.).

The DS processing unit 16 transmits the plurality of EC slices 42-48 to a plurality of DS units 36 of the DSN memory 22 via the DSN interface 32 and the network 24. The DSN interface 32 formats each of the slices for transmission via the network 24. For example, the DSN interface 32 may utilize an internet protocol (e.g., TCP/IP, etc.) to packetize the slices 42-48 for transmission via the network 24.

The number of DS units 36 receiving the slices 42-48 is dependent on the distributed data storage parameters established by the DS managing unit 18. For example, the DS managing unit 18 may indicate that each slice is to be stored in a different DS unit 36. As another example, the DS managing unit 18 may indicate that like slice numbers of different data segments are to be stored in the same DS unit 36. For example, the first slice of each of the data segments is to be stored in a first DS unit 36, the second slice of each of the data segments is to be stored in a second DS unit 36, etc. In this manner, the data is encoded and distributedly stored at physically diverse locations to improved data storage integrity and security.

Each DS unit 36 that receives a slice 42-48 for storage translates the virtual DSN memory address of the slice into a local physical address for storage. Accordingly, each DS unit 36 maintains a virtual to physical memory mapping to assist in the storage and retrieval of data.

The first type of user device 12 performs a similar function to store data in the DSN memory 22 with the exception that it includes the DS processing. As such, the device 12 encodes and slices the data file and/or data block it has to store. The device then transmits the slices 11 to the DSN memory via its DSN interface 32 and the network 24.

For a second type of user device 14 to retrieve a data file or data block from memory, it issues a read command via its interface 30 to the DS processing unit 16. The DS processing unit 16 performs the DS processing 34 to identify the DS units 36 storing the slices of the data file and/or data block based on the read command. The DS processing unit 16 may also communicate with the DS managing unit 18 to verify that the user device 14 is authorized to access the requested data.

Assuming that the user device is authorized to access the requested data, the DS processing unit 16 issues slice read commands to at least a threshold number of the DS units 36 storing the requested data (e.g., to at least 10 DS units for a 16/10 error coding scheme). Each of the DS units 36 receiving the slice read command, verifies the command, accesses its virtual to physical memory mapping, retrieves the requested slice, or slices, and transmits it to the DS processing unit 16.

Once the DS processing unit 16 has received a read threshold number of slices for a data segment, it performs an error decoding function and de-slicing to reconstruct the data segment. When Y number of data segments has been reconstructed, the DS processing unit 16 provides the data file 38 and/or data block 40 to the user device 14. Note that the first type of user device 12 performs a similar process to retrieve a data file and/or data block.

The storage integrity processing unit 20 performs the third primary function of data storage integrity verification. In general, the storage integrity processing unit 20 periodically retrieves slices 45, and/or slice names, of a data file or data block of a user device to verify that one or more slices have not been corrupted or lost (e.g., the DS unit failed). The retrieval process mimics the read process previously described.

If the storage integrity processing unit 20 determines that one or more slices is corrupted or lost, it rebuilds the corrupted or lost slice(s) in accordance with the error coding scheme. The storage integrity processing unit 20 stores the rebuild slice, or slices, in the appropriate DS unit(s) 36 in a manner that mimics the write process previously described.

Figure 2:
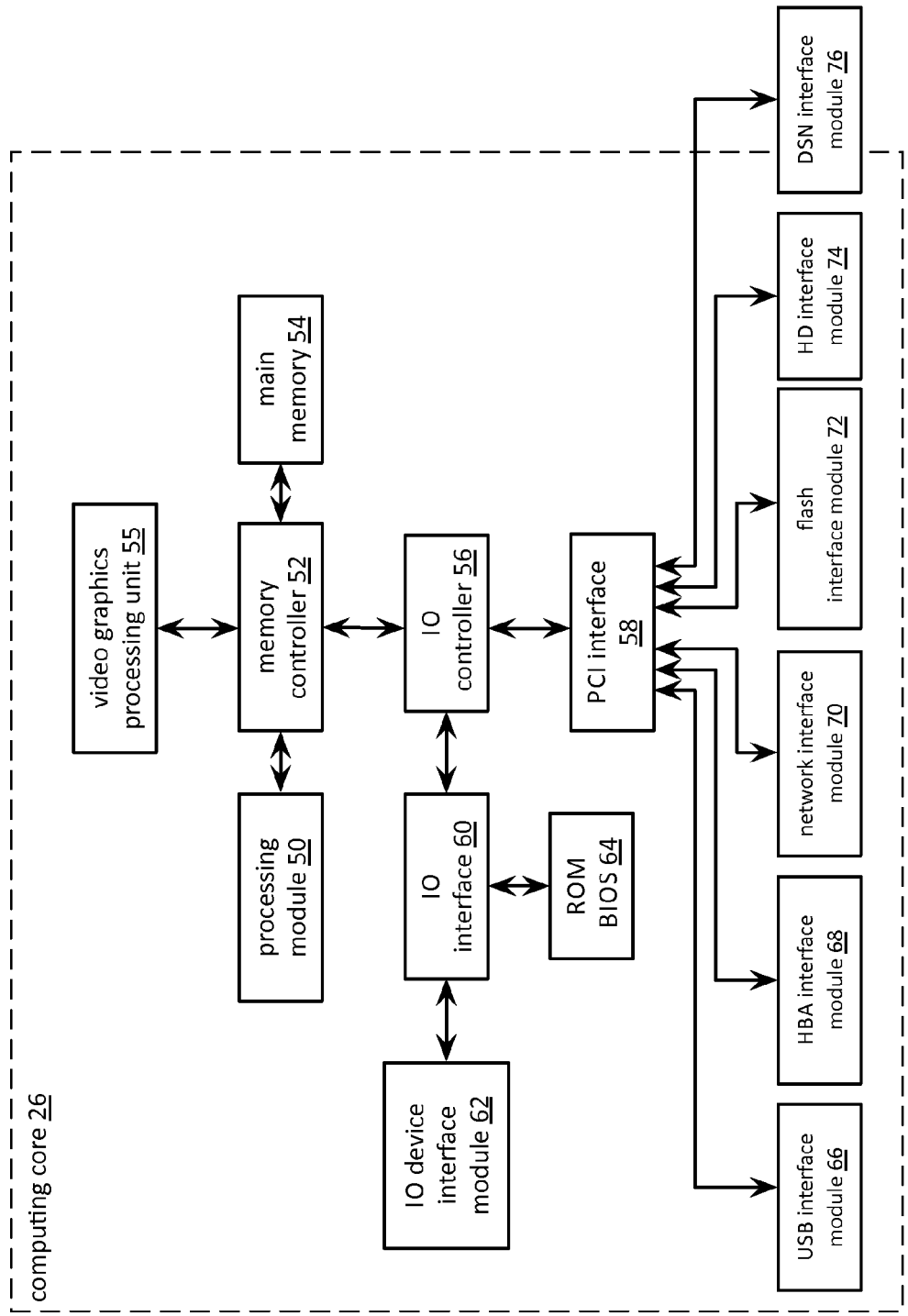
FIG. 2 is a schematic block diagram of an embodiment of a computing core in accordance with the present invention.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, at least one IO device interface module 62, a read only memory (ROM) basic input output system (BIOS) 64, and one or more memory interface modules. The memory interface module(s) includes one or more of a universal serial bus (USB) interface module 66, a host bus adapter (HBA) interface module 68, a network interface module 70, a flash interface module 72, a hard drive interface module 74, and a DSN interface module 76. Note the DSN interface module 76 and/or the network interface module 70 may function as the interface 30 of the user device 14 of FIG. 1. Further note that the IO device interface module 62 and/or the memory interface modules may be collectively or individually referred to as IO ports.

Figure 3:
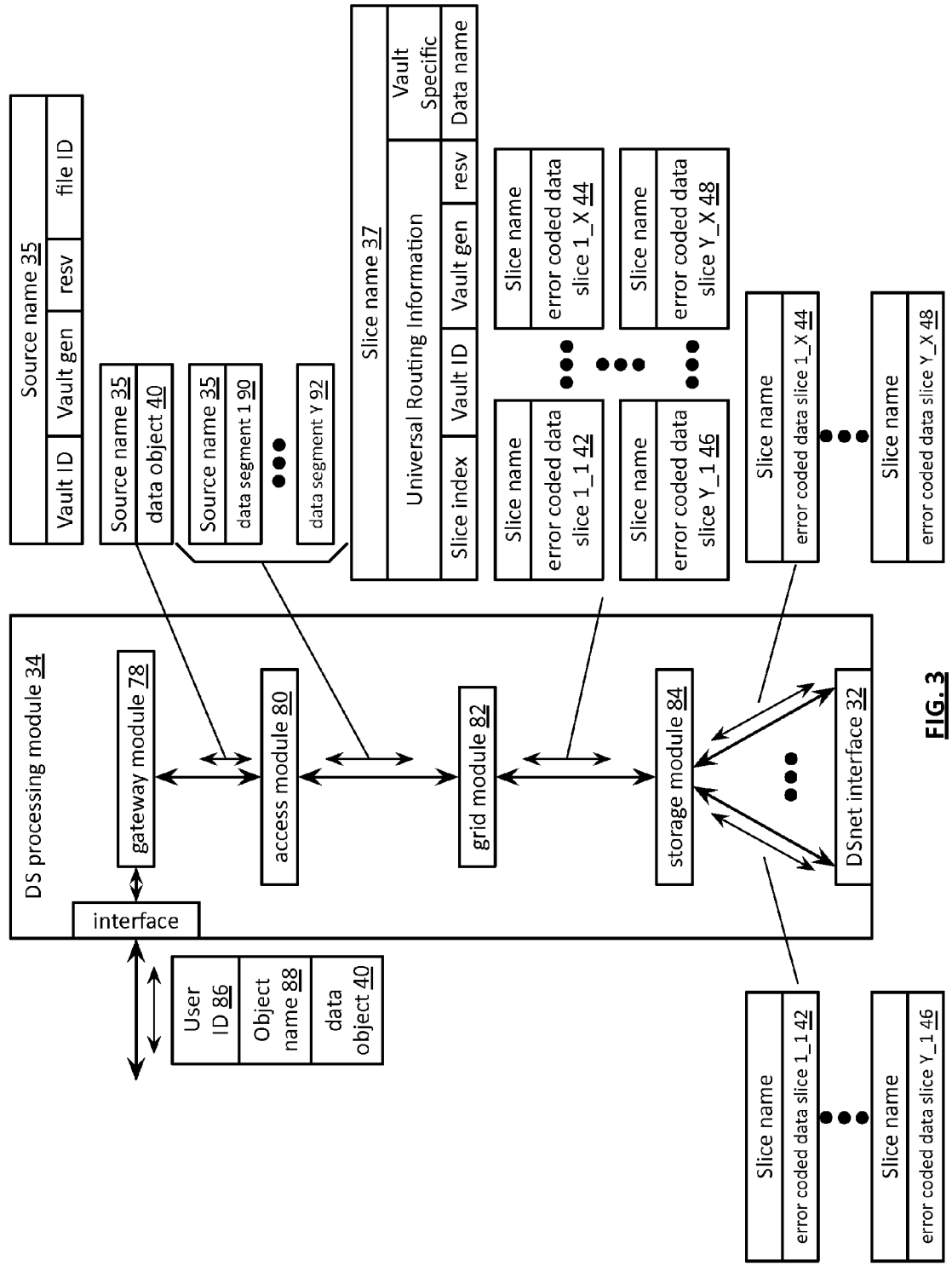
FIG. 3 is a schematic block diagram of an embodiment of a distributed storage processing unit in accordance with the present invention.

FIG. 3 is a schematic block diagram of an embodiment of a dispersed storage (DS) processing module 34 of user device 12 and/or of the DS processing unit 16. The DS processing module 34 includes a gateway module 78, an access module 80, a grid module 82, and a storage module 84. The DS processing module 34 may also include an interface 30 and the DSnet interface 32 or the interfaces 68 and/or 70 may be part of user 12 or of the DS processing unit 14. The DS processing module 34 may further include a bypass/feedback path between the storage module 84 to the gateway module 78. Note that the modules 78-84 of the DS processing module 34 may be in a single unit or distributed across multiple units.

In an example of storing data, the gateway module 78 receives an incoming data object that includes a user ID field 86, an object name field 88, and the data field 40 and may also receive corresponding information that includes a process identifier (e.g., an internal process/application ID), metadata, a file system directory, a block number, a transaction message, a user device identity (ID), a data object identifier, a source name, and/or user information. The gateway module 78 authenticates the user associated with the data object by verifying the user ID 86 with the managing unit 18 and/or another authenticating unit.

When the user is authenticated, the gateway module 78 obtains user information from the management unit 18, the user device, and/or the other authenticating unit. The user information includes a vault identifier, operational parameters, and user attributes (e.g., user data, billing information, etc.). A vault identifier identifies a vault, which is a virtual memory space that maps to a set of DS storage units 36. For example, vault 1 (i.e., user 1's DSN memory space) includes eight DS storage units (X=8 wide) and vault 2 (i.e., user 2's DSN memory space) includes sixteen DS storage units (X=16 wide). The operational parameters may include an error coding algorithm, the width n (number of pillars X or slices per segment for this vault), a read threshold T, a write threshold, an encryption algorithm, a slicing parameter, a compression algorithm, an integrity check method, caching settings, parallelism settings, and/or other parameters that may be used to access the DSN memory layer.

The gateway module 78 uses the user information to assign a source name 35 to the data. For instance, the gateway module 60 determines the source name 35 of the data object 40 based on the vault identifier and the data object. For example, the source name may contain a file identifier (ID), a vault generation number, a reserved field, and a vault identifier (ID). As another example, the gateway module 78 may generate the file ID based on a hash function of the data object 40. Note that the gateway module 78 may also perform message conversion, protocol conversion, electrical conversion, optical conversion, access control, user identification, user information retrieval, traffic monitoring, statistics generation, configuration, management, and/or source name determination.

The access module 80 receives the data object 40 and creates a series of data segments 1 through Y 90-92 in accordance with a data storage protocol (e.g., file storage system, a block storage system, and/or an aggregated block storage system). The number of segments Y may be chosen or randomly assigned based on a selected segment size and the size of the data object. For example, if the number of segments is chosen to be a fixed number, then the size of the segments varies as a function of the size of the data object. For instance, if the data object is an image file of 4,194,304 eight bit bytes (e.g., 33,554,432 bits) and the number of segments Y=131,072, then each segment is 256 bits or 32 bytes. As another example, if segment sized is fixed, then the number of segments Y varies based on the size of data object. For instance, if the data object is an image file of 4,194,304 bytes and the fixed size of each segment is 4,096 bytes, the then number of segments Y=1,024. Note that each segment is associated with the same source name.

The grid module 82 receives the data segments and may manipulate (e.g., compression, encryption, cyclic redundancy check (CRC), etc.) each of the data segments before performing an error coding function of the error coding dispersal storage function to produce a pre-manipulated data segment. After manipulating a data segment, if applicable, the grid module 82 error encodes (e.g., Reed-Solomon, Convolution encoding, Trellis encoding, etc.) the data segment or manipulated data segment into X error coded data slices 42-44.

The value X, or the number of pillars (e.g., X=16), is chosen as a parameter of the error coding dispersal storage function. Other parameters of the error coding dispersal storage function include a read threshold T, a write threshold W, etc. The read threshold (e.g., T=10, when X=16) corresponds to the minimum number of error-free error coded data slices required to reconstruct the data segment. In other words, the DS processing module 34 can compensate for X-T (e.g., 16-10=6) missing error coded data slices per data segment. The write threshold W corresponds to a minimum number of DS storage units that acknowledge proper storage of their respective data slices before the DS processing module indicates proper storage of the encoded data segment. Note that the write threshold is greater than or equal to the read threshold for a given number of pillars (X).

For each data slice of a data segment, the grid module 82 generates a unique slice name 37 and attaches it thereto. The slice name 37 includes a universal routing information field and a vault specific field and may be 48 bytes (e.g., 24 bytes for each of the universal routing information field and the vault specific field). As illustrated, the universal routing information field includes a slice index, a vault ID, a vault generation, and a reserved field. The slice index is based on the pillar number and the vault ID and, as such, is unique for each pillar (e.g., slices of the same pillar for the same vault for any segment will share the same slice index). The vault specific field includes a data name, which includes a file ID and a segment number (e.g., a sequential numbering of data segments 1-Y of a simple data object or a data block number).

Prior to outputting the error coded data slices of a data segment, the grid module may perform post-slice manipulation on the slices. If enabled, the manipulation includes slice level compression, encryption, CRC, addressing, tagging, and/or other manipulation to improve the effectiveness of the computing system.

When the error coded data slices of a data segment are ready to be outputted, the grid module 82 determines which of the DS storage units 36 will store the EC data slices based on a dispersed storage memory mapping associated with the user's vault and/or DS storage unit attributes. The DS storage unit attributes may include availability, self-selection, performance history, link speed, link latency, ownership, available DSN memory, domain, cost, a prioritization scheme, a centralized selection message from another source, a lookup table, data ownership, and/or any other factor to optimize the operation of the computing system. Note that the number of DS storage units 36 is equal to or greater than the number of pillars (e.g., X) so that no more than one error coded data slice of the same data segment is stored on the same DS storage unit 36. Further note that EC data slices of the same pillar number but of different segments (e.g., EC data slice 1 of data segment 1 and EC data slice 1 of data segment 2) may be stored on the same or different DS storage units 36.

The storage module 84 performs an integrity check on the outbound encoded data slices and, when successful, identifies a plurality of DS storage units based on information provided by the grid module 82. The storage module 84 then outputs the encoded data slices 1 through X of each segment 1 through Y to the DS storage units 36. Each of the DS storage units 36 stores its EC data slice(s) and maintains a local virtual DSN address to physical location table to convert the virtual DSN address of the EC data slice(s) into physical storage addresses.

In an example of a read operation, the user device 12 and/or 14 sends a read request to the DS processing unit 14, which authenticates the request. When the request is authentic, the DS processing unit 14 sends a read message to each of the DS storage units 36 storing slices of the data object being read. The slices are received via the DSnet interface 32 and processed by the storage module 84, which performs a parity check and provides the slices to the grid module 82 when the parity check was successful. The grid module 82 decodes the slices in accordance with the error coding dispersal storage function to reconstruct the data segment. The access module 80 reconstructs the data object from the data segments and the gateway module 78 formats the data object for transmission to the user device.

FIG. 4 is a schematic block diagram of an embodiment of a grid module 82 that includes a control unit 73, a pre-slice manipulator 75, an encoder 77, a slicer 79, a post-slice manipulator 81, a pre-slice de-manipulator 83, a decoder 85, a de-slicer 87, and/or a post-slice de-manipulator 89. Note that the control unit 73 may be partially or completely external to the grid module 82. For example, the control unit 73 may be part of the computing core at a remote location, part of a user device, part of the DS managing unit 18, or distributed amongst one or more DS storage units.

In an example of write operation, the pre-slice manipulator 75 receives a data segment 90-92 and a write instruction from an authorized user device. The pre-slice manipulator 75 determines if pre-manipulation of the data segment 90-92 is required and, if so, what type. The pre-slice manipulator 75 may make the determination independently or based on instructions from the control unit 73, where the determination is based on a computing system-wide predetermination, a table lookup, vault parameters associated with the user identification, the type of data, security requirements, available DSN memory, performance requirements, and/or other metadata.

Once a positive determination is made, the pre-slice manipulator 75 manipulates the data segment 90-92 in accordance with the type of manipulation. For example, the type of manipulation may be compression (e.g., Lempel-Ziv-Welch, Huffman, Golomb, fractal, wavelet, etc.), signatures (e.g., Digital Signature Algorithm (DSA), Elliptic Curve DSA, Secure Hash Algorithm, etc.), watermarking, tagging, encryption (e.g., Data Encryption Standard, Advanced Encryption Standard, etc.), adding metadata (e.g., time/date stamping, user information, file type, etc.), cyclic redundancy check (e.g., CRC32), and/or other data manipulations to produce the pre-manipulated data segment.

The encoder 77 encodes the pre-manipulated data segment 92 using a forward error correction (FEC) encoder (and/or other type of erasure coding and/or error coding) to produce an encoded data segment 94. The encoder 77 determines which forward error correction algorithm to use based on a predetermination associated with the user's vault, a time based algorithm, user direction, DS managing unit direction, control unit direction, as a function of the data type, as a function of the data segment 92 metadata, and/or any other factor to determine algorithm type. The forward error correction algorithm may be Golay, Multidimensional parity, Reed-Solomon, Hamming, Bose Ray Chauduri Hocquenghem (BCH), Cauchy-Reed-Solomon, or any other FEC encoder. Note that the encoder 77 may use a different encoding algorithm for each data segment 92, the same encoding algorithm for the data segments 92 of a data object, or a combination thereof.

The encoded data segment 94 is of greater size than the data segment 92 by the overhead rate of the encoding algorithm by a factor of X/T, where X is the width or number of slices, and T is the read threshold. In this regard, the corresponding decoding process can accommodate at most X-T missing EC data slices and still recreate the data segment 92. For example, if X=16 and T=10, then the data segment 92 will be recoverable as long as 10 or more EC data slices per segment are not corrupted.

The slicer 79 transforms the encoded data segment 94 into EC data slices in accordance with the slicing parameter from the vault for this user and/or data segment 92. For example, if the slicing parameter is X=16, then the slicer 79 slices each encoded data segment 94 into 16 encoded slices.

The post-slice manipulator 81 performs, if enabled, post-manipulation on the encoded slices to produce the EC data slices. If enabled, the post-slice manipulator 81 determines the type of post-manipulation, which may be based on a computing system-wide predetermination, parameters in the vault for this user, a table lookup, the user identification, the type of data, security requirements, available DSN memory, performance requirements, control unit directed, and/or other metadata. Note that the type of post-slice manipulation may include slice level compression, signatures, encryption, CRC, addressing, watermarking, tagging, adding metadata, and/or other manipulation to improve the effectiveness of the computing system.

In an example of a read operation, the post-slice de-manipulator 89 receives at least a read threshold number of EC data slices and performs the inverse function of the post-slice manipulator 81 to produce a plurality of encoded slices. The de-slicer 87 de-slices the encoded slices to produce an encoded data segment 94. The decoder 85 performs the inverse function of the encoder 77 to recapture the data segment 90-92. The pre-slice de-manipulator 83 performs the inverse function of the pre-slice manipulator 75 to recapture the data segment 90-92.

FIG. 5 is a diagram of an example of slicing an encoded data segment 94 by the slicer 79. In this example, the encoded data segment 94 includes thirty-two bits, but may include more or less bits. The slicer 79 disperses the bits of the encoded data segment 94 across the EC data slices in a pattern as shown. As such, each EC data slice does not include consecutive bits of the data segment 94 reducing the impact of consecutive bit failures on data recovery. For example, if EC data slice 2 (which includes bits 1, 5, 9, 13, 17, 25, and 29) is unavailable (e.g., lost, inaccessible, or corrupted), the data segment can be reconstructed from the other EC data slices (e.g., 1, 3 and 4 for a read threshold of 3 and a width of 4).

Figure 6:
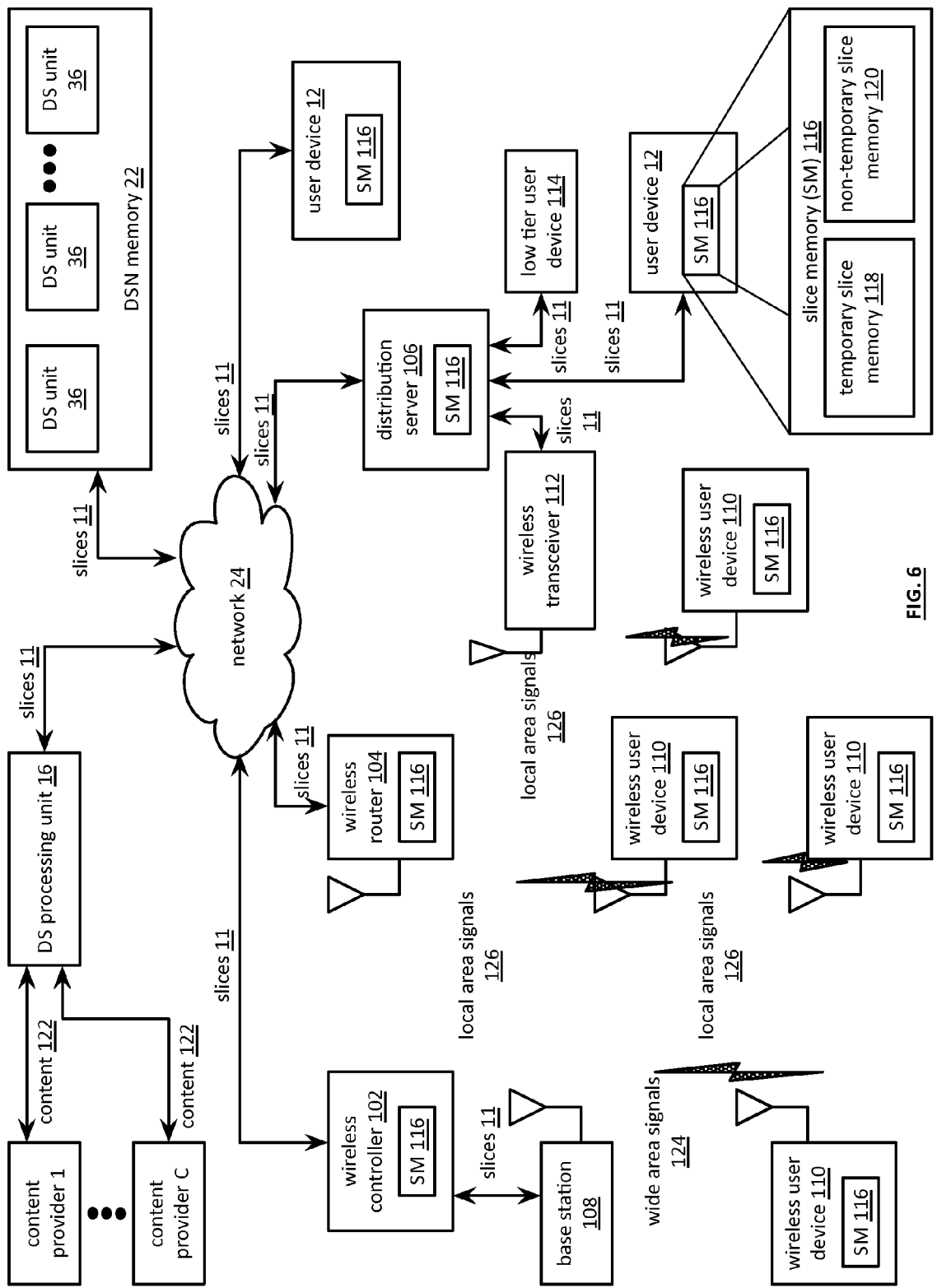
FIG. 6 is a schematic block diagram of another embodiment of a computing system in accordance with the present invention.

FIG. 6 is a schematic block diagram of another embodiment of a computing system that includes a plurality of content providers 1-C, a dispersed storage (DS) processing unit 16, a network 24, a dispersed storage network (DSN) memory 22, a wireless controller 102, a base station 108, a wireless router 104, a distribution server 106, a plurality of user devices 12, a wireless transceiver 112, a low tier user device 114, and a plurality of wireless user devices 110. Each of the wireless controller 102, the wireless router 104, the distribution server 106, the user device 12, and the wireless user device 110 may include slice memory (SM) 116, which includes a temporary slice memory and a non-temporary slice memory 120.

Each of the content providers 1-C provides content 122 for distribution to the user devices (e.g., low tier user device 114, user device 12, wireless user device 110), where the content 122 includes multimedia, video, movies, music, audio recordings, pictures, sound files, image files, applications, and/or software. A content provider may add a content descriptor to its content 122, where the content descriptor includes a content type, a genre type, an artist, a movie type, a music type, a release date, pricing information, purchase indicator information, a demographic indicator, a favorite syndicator, a quality rating, and/or an industry rating. Note that the content descriptor may be embedded in the content 122 or conveyed separately.

In an example of operation, a content provider has content 122 that it desires to distribute to a plurality of user devices in an efficient manner. For example, the content provider desired to distribute content on a release date in an efficient manner (e.g., with as minimal impact on the network and with as minimal delay to the user devices as practical). In this regard, the content provider provides the content to a DS processing unit 16 prior to, or concurrently with, making the content available to the public (e.g., the user devices).

The DS processing unit 16 dispersed storage error encode the content 122 to produce a plurality of sets of encoded data slices, where a set of encoded data slices corresponds to an encoded data segment of the content. The DS processing unit sends the slices 11 to the DSN memory 22 for storage therein. In addition, the DS processing unit distributes an unreadable portion of the content 122 to the user devices. The unreadable portion may be, for a set of the plurality of sets of encoded data slices, a sub-set of encoded data slices that include less than a decode threshold number of slices. For example, if the dispersed storage error coding parameters include a pillar width of 16 and a decode threshold of 10, then the sub-set of encoded data slices would be less than 10 (e.g., 8 or 9).

To facilitate the distribution of the sub-set of slices, the DS processing unit 16 identifies the targeted user devices 110, 12, 114, based on information from the content provider (e.g., a list of subscribers, of pre-paid orders, etc.) or information it derives (e.g., likely to want the content, user devices in its domain, etc.). Having identified the targeted user devices, the DS processing unit sends write requests regarding the sub-set of encoded data slices to the targeted user devices in accordance with a distribution scheme (e.g., what network resources to use, time of day to transmit, how many slices to transmit for a given transmission, distribution duration—i.e., how much time to get the sub-set of slices to the targeted user devices, etc.). The write requests include the sub-set of encoded data slices and an instruction to store them in the temporary slice memory 118.

When a user device desires the remainder of the content (e.g., release date occurs for a pre-paid content, a command from the user of the device, an automatic determination process, etc.), the user device sends a request for the remaining encoded data slices of the set of encoded data slices, which may be done for each of the sets separately, for the sets as a whole, or for groupings of sets. Upon receiving and validating the request, the DS processing unit sends the remaining encoded data slices of the set, or a portion thereof, to the user device. The user device may then decode the received set of encoded data slices to recapture the data segment of the content.

When a user device does not desire the remainder of the content, it deletes the sub-set of encoded data slices from it temporary slice memory. In this regard, the user device may delete the slices based on a command from the DS processing unit 16, from a command embedded in the slices, or in response to a request as to what to do with the slices.

As a specific example, a wireless user device 110 is a targeted user device and has requested the remaining portion of the content. The request and subsequent transmission of encoded data slices may be conveyed via a base station 108, a wireless controller 102, a wireless transceiver 112, a distribution server 106, and/or a wireless router 104. The wireless controller 102 controls the base station 108 such that the base station 108 converts slices 11 to wide-area signals 124 for transmission to one or more wireless user devices 110. The base station 108 may operate in accordance with one or more industry standards (e.g., global system for mobile communications (GSM), code division multiple access (CDMA), etc.)

and is operable to transmit and receive wide-area signals. The wireless router 104 is operable to convert slices 11 into local area signals 126 for transmission to one or more wireless user devices 110. The wireless router 104 may operate in accordance with one or more industry standards (e.g., WIFI, Bluetooth, etc.) to transmit and receive the local area signals 126.

The distribution server 106 distributes slices 11 (e.g., via a wireline or wireless connection) to one or more of the wireless transceiver 112, the low tier user device 114, and the user device 12. The wireless transceiver 112 converts slices 11 into local area signals 126 for transmission to one or more wireless user devices 110. The wireless transceiver 112 may operate in accordance with one or more industry standards (e.g., WIFI, Bluetooth, etc.) to transmit and receive the local area signals 126.

In another example of operation, a wireless user device 100 that is operably coupled to the base station 108 determines a user content preference and identifies target content in accordance with the user content preference. Based on the targeted content, the wireless user device 110 identifies public pillars (e.g., a sub-set of encoded data slices) of the target content for a partial download and determines a partial downloading schedule (e.g., sending slices during off hours such that base station effectiveness is not compromised). For example, the wireless user device 110 sends a slice retrieval request to the DSN memory 22, wherein the request includes a slice name associated with a public pillar encoded data slice. Alternatively, or in addition to, the DS processing unit 16 determines the user content preference, identifies the target content, identifies the public pillars, determines the partial downloading schedule, and facilitates partial downloading of the target content.

Continuing with this example, the wireless user device 110 receives the public pillar encoded slices, via the wide area signals 124, and stores them in temporary slice memory 118. Next, the wireless user device 110 determines whether the target content is desired. When the target content is desired, the wireless user device 110 identifies one or more required private pillars of the desired target content (e.g., remaining encoded data slices of a set) and requests them. Upon receiving the private pillar encoded data slices, the wireless user devices stores them in non-temporary slice memory 120 and moves the public pillar encoded data slices from the temporary slice memory 118 to the non-temporary slice memory 120.

As yet another example of operation, the DS processing unit 16 facilitates the downloading of content in an efficient. For instance, the DS processing unit selects network edge units for staging public pillar encoded data slices, where the network edge units includes the wireless controller 102, the wireless router 104, the distribution server 106, a user device 12, and/or a wireless user device 110. The DS processing unit 16 then identifies target content for partial download to the network edge units and identifies public pillars of the target content. The DS processing unit further determines a partial downloading schedule for sending the public pillar encoded data slices to the network edge units in accordance with the downloading schedule.

Continuing with the preceding example, a user device 12 and/or a wireless user device 110 identify target content for partial downloading. The user device requests a download of the public pillar encoded data slices from a network edge unit and, upon receiving the slices, stores them in temporary slice memory 118. When the user device desires downloading the remainder of the content, it requests a download of the private pillar encoded data slices from the DSN memory 22 and/or from a network edge unit.

Figure 7A:
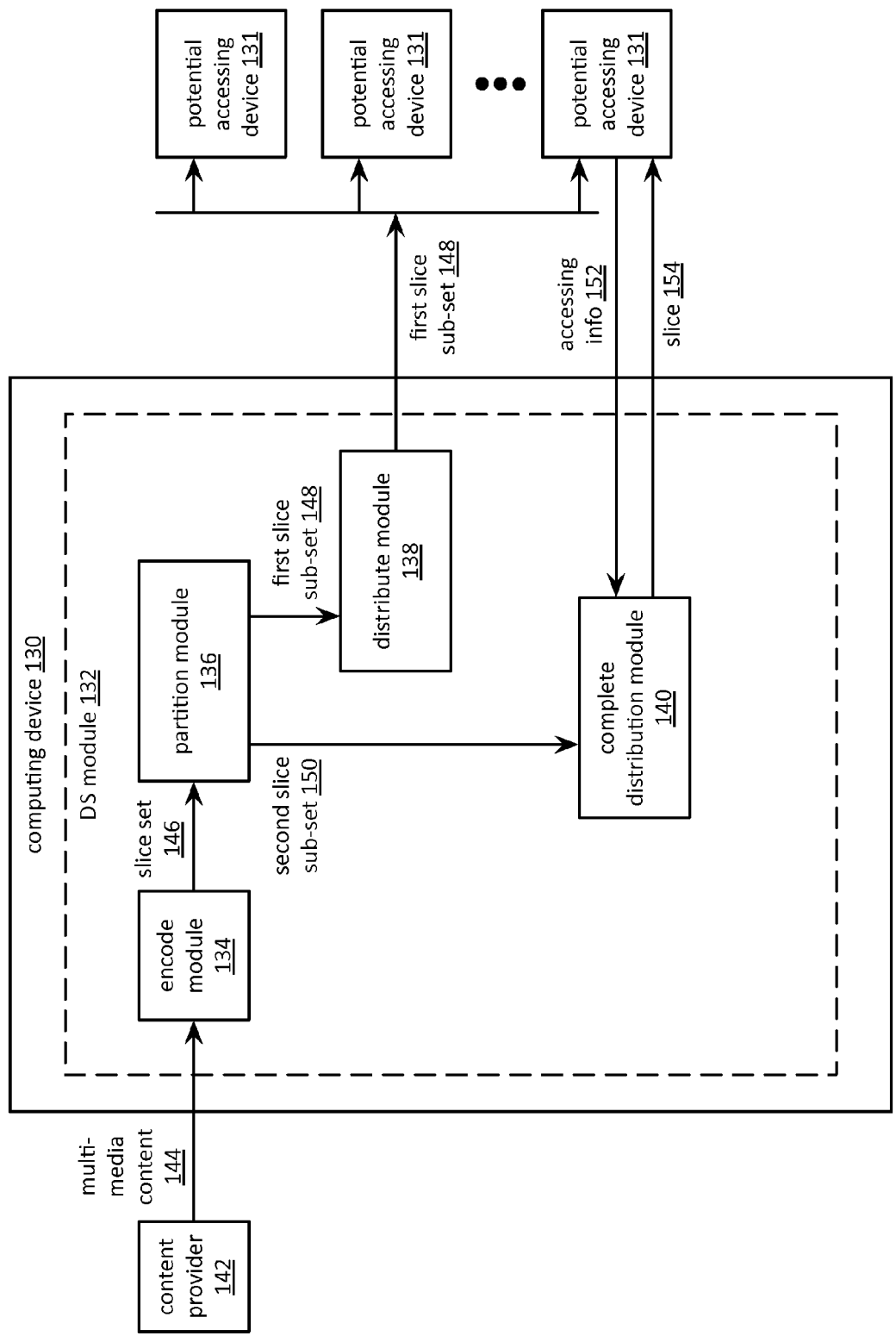
FIG. 7A is a schematic block diagram of another embodiment of a computing system in accordance with the present invention.

FIG. 7A is a schematic block diagram of another embodiment of a computing system that includes a content provider 142, a computing device 130, and a plurality of potential accessing devices 131. The computing device 130 may be implemented as a dispersed storage (DS) processing unit, a user device 12, and/or a DS unit. Each accessing device 131 may be implemented as a user device, a DS unit, and/or another DS processing unit. For example, the computing device 130 is a DS processing unit commissioned to distribute multi-media content to user devices as the potential accessing devices 131. The computing device 130 includes a DS module 132 which includes an encode module 134, a partition module 136, a distribute module 138, and a complete distribution module 140.

The encode module 134 encodes a data segment of multi-media content 144 using a dispersed storage error coding function to produce a set of encoded data slices 146. The partition module 136 partitions the set of encoded data slices 146 into a first sub-set of encoded data slices 148 and a second sub-set of encoded data slices 150, wherein the first sub-set of encoded data slices 148 include less than a decode threshold number of encoded data slices. The encode module 134 and or partition module may include a delete function with the encoded data slices 148 which causes the user device to delete the first sub-set of encoded data slices 148 when the accessing information 152 (e.g., request for the remainder of the content) is not received in a specified time frame.

The partition module 136 may partition the set of encoded data slices 146 based on a pillar pattern, which includes less than the decode threshold number of encoded data slices for the first sub-set. The partition module may select the pillar pattern based on the multi-media content 144, the decode threshold number, a pillar width, a security requirement, a bandwidth availability indicator, and/or a cost of bandwidth indicator. For example, the partition module 136 selects 9 pillars when the decode threshold number is 10. As another example, the partition module 136 selects 16 pillars when the decode threshold number is 24 and a bandwidth availability indicator is below a bandwidth threshold (e.g., lower than average bandwidth availability to send the first sub-set of encoded data slices 148).

The distribute module 138 distributes the first sub-set of encoded data slices 148 to the potential accessing devices 131. For example, the distribute module 138 distributes the first sub-set of encoded data slices 148 in advance of an available purchase date. As another example, the distribute module 138 identifies the potential accessing devices 131 based on a likelihood of consumption (e.g., based on preferences such as a preferred genre, artists, movie type, music type etc. and/or a consumption pattern) of the multi-media content 144 by the potential accessing device 131, receiving a content request (e.g., a purchase request) from the potential accessing device 131, receiving a pre-purchase order for the multi-media content 144 from the potential accessing device 131, and polling the potential accessing device 131 regarding accessing the multi-media content 144.

As yet another example, the distribute module 138 determines a distribution scheme and distributing the first sub-set of encoded data slices 148 in accordance with the distribution scheme. For instance, the distribution scheme may include using one or more connectivity routes to the potential accessing devices, determining a system loading threshold, determining a time of day factor, and/or identifying intermediate devices to facilitate the distribution of the first sub-set of encoded data slices 148. For example, the distribute module 138 determines to distribute the first sub-set of encoded data slices 148 to the potential accessing device 131 by sending the first sub-set of encoded data slices 148 to a base station first intermediate device at 3 PM and scheduling a final distribution of the first subset of encoded data slices 148 from the base station first intermediate device to the potential accessing device 131 at 1 AM via a wide-area wireless network when available bandwidth is high and cost is low.

The complete distribution module 140 sends at least one of the encoded data slices 154 of the second sub-set of encoded data slices 150 to a user device in response to receiving accessing information 152 such that the device has a decode threshold number of encoded data slices. The accessing information 152 includes purchasing information to purchase the multi-media content 144 and/or viewing information regarding viewing of the multi-media content 144. The purchasing information includes a requesting entity identifier, a potential accessing device identifier, a multi-media content identifier of the multi-media content 144, one or more slice identifiers corresponding to previously received encoded data slices of the first sub-sub of encoded data slices 148, and/or e-commerce transaction information (e.g., a credit card number). The viewing information includes a watch now indicator, a watch later indicator, a watch at any lowest cost possible indicator, and a watch and/or a specific time frame indicator.

Figure 7B:
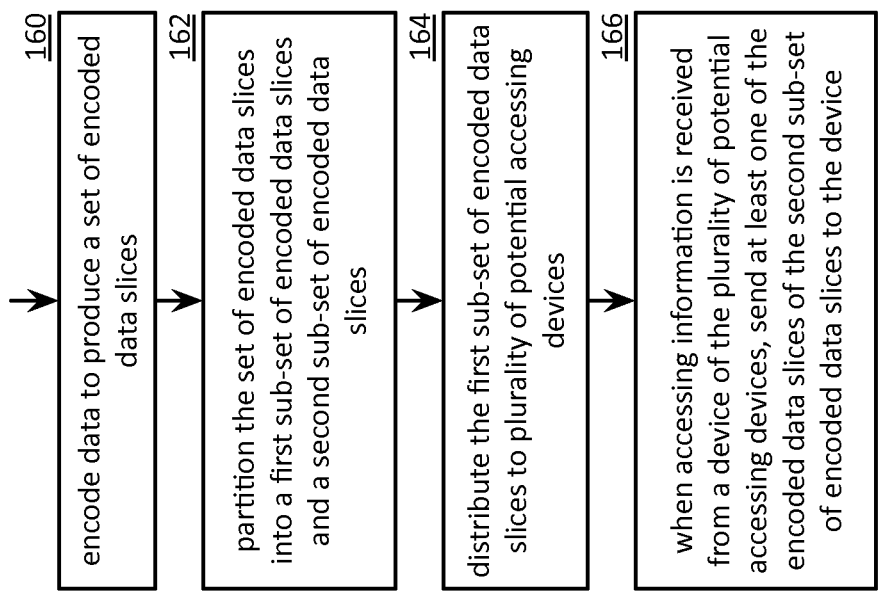
FIG. 7B is a flowchart illustrating an example of distributing multi-media content in accordance with the present invention.

FIG. 7B is a flowchart illustrating an example of distributing multi-media content. The method begins at step 160 were a processing module (e.g., of a dispersed storage (DS) module) encodes a data segment of multi-media content using a dispersed storage error coding function to produce a set of encoded data slices. The encoding may further include embedding a delete function within a first sub-set of encoded data slices, wherein the delete function is activated to delete the first sub-set of encoded data slices when accessing information is not received in a specified time frame.

The method continues at step 162 where the processing module partitions the set of encoded data slices into a first sub-set of encoded data slices and a second sub-set of encoded data slices, wherein the first sub-set of encoded data slices include less than a decode threshold number of encoded data slices. The method continues at step 164 where the processing module distributes the first sub-set of encoded data slices to a plurality of potential accessing devices, which may be done in advance of a release date, in accordance with a distribution scheme, etc. This step may further include identifying the potential accessing devices, which may be done in a variety of ways. For example, a potential accessing device may be identified based on a likelihood of consumption of the multi-media content, by receiving a content request from the potential accessing device, receiving a pre-purchase order for the multi-media content from the potential accessing device, and/or polling the potential accessing device regarding accessing the multi-media content. As another example, a potential accessing device may be identified based on a user content preference, a new content listing message, user desired content, a user content selection, user content selection history, a predictive algorithm, a message, a match to a demographic fit, and/or content already distributed.

When accessing information from a device of the potential accessing devices is received, the method continues at step 166 where the processing module sends at least one of the encoded data slices of the second sub-set of encoded data slices to the device such that the device has the decode threshold number of encoded data slices. The accessing information includes purchasing information regarding purchasing the multi-media content and/or viewing information regarding viewing of the multi-media content. Note that the at least one of the encoded data slices may be sent in accordance with a transmission protocol, which includes identifying encoded data slices of the set of encoded data slices previously obtained by the device and selecting the at least one of the encoded data slices from other slices of the set of slices such that the device has the decode threshold number of encoded data slices.

FIG. 8A is a flowchart illustrating another example of facilitating partial content downloading. The method begins at step 170 were a processing module (e.g., of a dispersed storage (DS) processing unit, a user device) identifies target content for a user device group. The determination may be based on one or more of a user group content preference, a new content listing message, user group desired content, a user group content selection, user group content selection history, a predictive algorithm, a message, a match to a demographic fit, and content already sent. For example, the processing module identifies the target content when the target content includes music from an artist that matches an artist entry of at least one user of the user group content preference.

The method continues at step 172 where the processing module identifies less than a decode threshold number of pillars corresponding to the target content for partial download. This may be done based on the target content, error coding parameters (e.g., a pillar width, a decode threshold, a write threshold, a read threshold), an amount of data per pillar, a security requirement, a performance requirement, predetermination, a lookup, a pillar assignment for the user device, and a query. For example, the processing module identifies pillars 1-9 as the public pillars corresponding to the target content when a decode threshold is 10 and the security requirement indicates a withholding pattern to withhold one pillar. The withholding pattern may indicate to withhold one or more pillars of a decode threshold number of pillars.

The method continues at step 174 where the processing module selects a user device of the user device group for storage of each public pillar. The selecting may be based on one or more of a user device availability indicator, a level of user device storage availability, and a user device security performance level indicator. For example, the processing module selects a first user device when the first user device is associated with a user device storage availability that is greater than a level of user device storage availability of substantially all other user devices of the user device group.

The method continues at step 176 where the processing module determines a partial downloading schedule for sending public pillar encoded data slices corresponding to the public pillars. The schedule may include a start time, an end time, how much of the target content to partially download, a minimum download rate, an average download rate, and a maximum download rate. The determining may be based on one or more of a location of each user device of the user device group, an availability indicator of each user device of user device group, a local network loading indicator associated with a network edge unit associated with each user device of the user device group, a network loading indicator, historical network loading information, the target content, the size of the target content, a size of encoded data slices associated with the public pillars, user device availability of the selected user device, a user device type indicator (e.g., wireless and/or wireline), and a security requirement. For example, the processing module determines to start the download to a wireless user device, with a maximum download rate of 10 kilobits per second, at 2 AM and complete the download by 3 AM when the historical network loading information indicates that a network edge unit associated with the user device typically has more available capacity in this time frame and the wireless user device is available.

The method continues at step 178 where the processing module facilitates partial downloading of the target content by facilitating sending of the public pillar encoded data slices to at least the user device of the user device group. The facilitating includes at least one of retrieving the public pillar encoded data slices when the processing module is associated with the user device and requesting sending of the public pillar encoded data slices when the processing module is associated with a DS processing unit.

FIG. 8B is a flowchart illustrating an example of acquiring multi-media content. The method begins with step 180 where a processing module (e.g., of a user device, a potential accessing device) receives public pillar encoded data slices of target content. The receiving includes receiving the public pillar encoded data slices from at least one of a dispersed storage network (DSN) memory, a dispersed storage (DS) processing unit, a network edge unit, and another user device of a user device group. The method continues at step 182 where the processing module stores the public pillar encoded data slices in a temporary slice memory (e.g., of a slice memory of a user device). Alternatively, or in addition to, the processing module may forward at least some of the public pillar encoded data slices to at least one other user device of a user device group when the other user device requires the public pillar encoded data slices.

The method continues at step 184 where the processing module determines whether target content corresponding to the public pillar encoded data slices are desired (e.g., does the user device want a partial download of the content). The determining may be based on one or more of a query, sending an indication of the target content (e.g., to a user interface), receiving a user selection input, receiving a user device group selection, a predetermined selection, a target content list, an available memory indicator, a cost indicator, and a user content preference. The method loops back to step 180 when the processing module determines that the target content is not desired. The method continues to step 186 when the processing module determines that the target content is desired.

The method continues at 186 where the processing module identifies one or more required private pillars of the desired target content. The identification may be based on one or more of a query, a security requirement, a pillar assignment corresponding to the user device, a pillar assignment corresponding to the user device group, private pillars stored in the user device group, a lookup, error coding parameters, and a number of public pillars stored in the temporary slice memory. For example, the processing module determines pillars 8-11 as the required private pillars when public pillars 1-7 are already stored in the temporary slice memory, pillars 8-9 are stored in at least one other user device of the user device group, and a decode threshold of the error coding parameters is 11. As another example, the processing module determines pillars 15-16 as the required private pillars when pillars 1-9 are stored in the temporary slice memory, a decode threshold of the error coding parameters is 10, the read threshold is 11, and the pillar assignment corresponding to the user device group indicates to utilize pillars 15-16.

The method continues at step 188 where the processing module requests encoded data slices corresponding to the one or more required private pillars. The requesting includes sending at least one encoded data slice request to one or more of a dispersed storage (DS) processing unit, another user device of the user device group, and a DSN memory, wherein the request includes at least one slice name associated with the one or more required private pillars. The method continues at step 190 where the processing module receives private pillar encoded data slices of the desired content. The method continues at step 192 where the processing module stores the private pillar encoded data slices in non-temporary slice memory. The method continues at step 194 where the processing module moves the public pillar encoded data slices from the temporary slice memory to the non-temporary slice memory. In addition, the processing module may retrieve at least a decode threshold number of encoded data slices for each data segment of the desired target content stored in the non-temporary slice memory, dispersed storage error decode the at least decode threshold number of encoded data slices for each data segment to produce a plurality of data segments, and aggregate the plurality of data segments to reproduce the desired target content.

Figure 9:
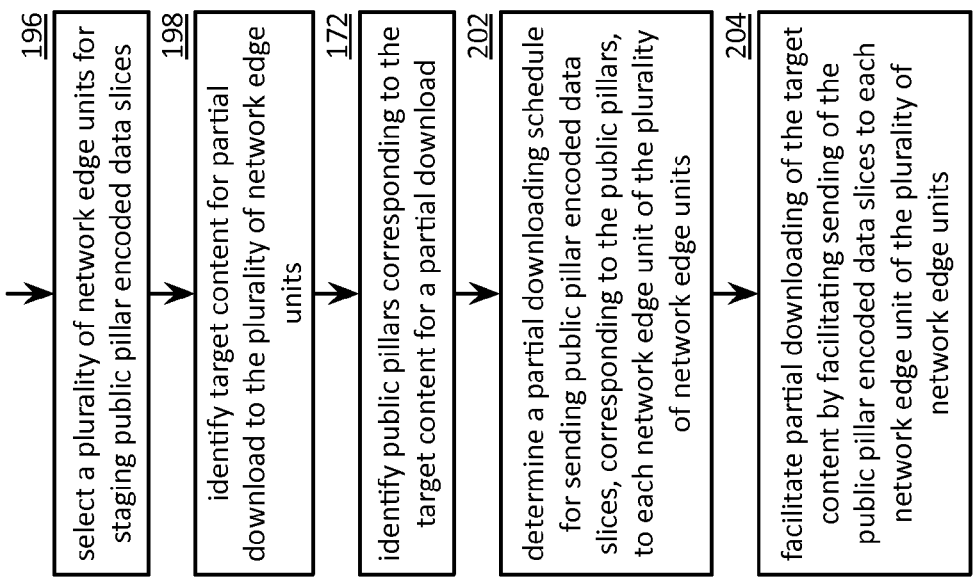
FIG. 9 is a flowchart illustrating an example of staging content for downloading in accordance with the present invention.

FIG. 9 is a flowchart illustrating an example of staging content for downloading. The method begins at step 196 where a processing module (e.g., a dispersed storage (DS) processing unit) selects a plurality of network edge units for staging public pillar encoded data slices. The selection may be based on one or more of a list of units, a unit request, a user device operably coupled to the unit, a geographic area associated with a unit, a content preference of a user device, a previous partial download list, a new content listing message, a desired content indicator of a user device, and a content selection history of a user device. For example, processing module selects a network edge unit that is operably coupled to a user device that may require target content downloading.

The method continues at step 198 where the processing module identifies target content for partial download to the plurality of network edge units. The identifying may be based on one or more of a unit request, a user device operably coupled to the unit, a content preference of a user device, a previous partial download list, a new content listing message, a desired content indicator of a user device, and a content selection history of a user device. The method continues with step 172 of FIG. 8A where the processing module identifies public pillars corresponding to the target content for partial download.

The method continues at step 202 where the processing module determines a partial downloading schedule for sending public pillar encoded data slices, corresponding to the public pillars, to each network edge unit of the plurality of network edge units. The schedule may include a start time, an end time, how much of the target content to partially download, a minimum download rate, an average download rate, and a maximum download rate. The determining may be based on one or more of a location of the network edge unit, an availability indicator of the network edge unit, a network loading indicator associated with the network edge unit, and available network bandwidth associated with the network edge unit, a location of a user device, an availability indicator of a user device associated with the network edge unit, a network loading indicator, historical network loading information, the target content, the size of the target content, a size of encoded data slices associated with the public pillars, a user device type indicator (e.g., wireless and/or wireline), and a security requirement. For example, the processing module determines to start the download to a network edge unit, with a maximum download rate of 5 Mb per second, at 11:01 PM and complete the download by 11:15 PM when the historical network loading information indicates that the network edge unit typically has more available network bandwidth in this time frame.

The method continues at step 204 where the processing module facilitates partial downloading of the target content by facilitating sending of the public pillar encoded data slices to each network edge unit of the plurality of network edge units. The facilitating includes at least one of retrieving the public pillar encoded data slices when the processing module is associated with the network edge unit and requesting sending of the public pillar encoded data slices when the processing module is associated with a DS processing unit.

FIG. 10A is a schematic block diagram of another embodiment of a computing system that includes a dispersed storage (DS) processing unit 16, a computing device 210, and at least one potential accessing device 131. The computing device 210 may be implemented as at least one of a potential accessing device 131 and a user device. For example, the DS processing unit 16 distributes multi-media content to a plurality of potential accessing devices 131 that includes the potential accessing device 131 and the computing device 210. The computing device 210 includes a DS module 212 and a memory 214. The memory 214 may be implemented utilizing one or more memory devices including one or more of a FLASH memory, random access memory, a magnetic disk drive, and an optical disk drive. The DS module 212 includes a receive first slice sub-set module 216, a determine whether to request module 218, a send accessing information module 220, a receive slice module 222, and a remedy slice error module 224.

The receive first slice sub-set module 216, when operable within the computing device 210, causes the computing device 210 to receive a first sub-set of encoded data slices 148, wherein a data segment of multi-media content was encoded using a dispersed storage error coding function to produce a set of encoded data slices, wherein the set of encoded data slices is partitioned into the first sub-set of encoded data slices 148 and a second sub-set of encoded data slices, and wherein the first sub-set of encoded data slices 148 includes less than a decode threshold number of encoded data slices. The receive first slice sub-set module 216 is operable to receive the first sub-set of encoded data slices 148 by receiving a distribution of the first sub-set of encoded data slices 148 to a plurality of potential accessing devices 131.

The receive first slice sub-set module 216 is further operable to receive the first sub-set of encoded data slices 148 by at least one of receiving a message that includes the first sub-set of encoded data slices 148 from at least one of the potential accessing device 131, a dispersed storage (DS) processing unit, a user device, and an intermediate edge device of a dispersed storage network (DSN), receiving the first sub-set of encoded data slices 148 in accordance with a registered user program of a network (e.g., a wireless device affiliates with a next site in a multisite wireless system), and sending a request message for the first sub-set of encoded data slices 148. The sending includes identifying the multi-media content as likely to be acquired, generating the request, and outputting the request.

The receive first slice sub-set module 216 is further operable to determine whether to forward one or more of the first sub-set of encoded data slices 148 to a user device (e.g., another potential accessing device 131) and forward the one or more of the first sub-set of encoded data slices 148 to the user device. The determining may be based on one or more of receiving a request from the user device, determining that a likelihood level of acquisition of the multi-media content by the user device compares favorably with a likelihood level of acquisition threshold, and determining that a slice error exists of storage of the first sub-set of encoded data slices 148 within the user device.

The determine whether to request module 218, when operable within the computing device 210, causes the computing device 210 to determine whether to request the second sub-set of encoded data slices. The determine whether to request module 218 is operable to determine whether to request the second sub-set of encoded data slices by determining when the multi-media content is available for purchase and when the multi-media content becomes available for purchase, indicating that the second sub-set of encoded data slices is to be requested.

The determine whether to request module 218 is further operable to determine whether to request the second sub-set of encoded data slices by at least one of determining whether a storage time frame of the first sub-set of encoded data slices has expired and, when the storage time frame has expired, indicating the that the second sub-set of encoded data slices is not going to be requested (e.g., acquisition unlikely when too much time has elapsed), and determining a probability that the second sub-set of encoded data slices will be requested and, when the probability is likely that the second sub-set of encoded data slices will be requested, indicating that the second sub-set of encoded data slices is to be requested. For example, the probability that the second sub-set of encoded data slices will be requested is certain when receiving a user input selecting the multi-media content for purchase and/or viewing. As another example, the probability that the second sub-set of encoded data slices will be requested is high when an attribute of the multi-media content substantially matches a desired attribute (e.g., content is on a desired playlist, content matches user preferences such as artist, genre, topic, type, etc).

The determine whether to request module 218 is further operable to adjust the storage time frame. For example, the storage time frame is shortened when memory 214 has less available storage capacity. The determine whether to request module 218 is further operable to temporarily store the first sub-set of encoded data slices (e.g., in the memory 214) prior to sending the accessing information 152 and when the second sub-set of encoded data slices is not to be requested, facilitate deletion of the first sub-set of encoded data slices 148 (e.g., deleting from the memory 214).

The send accessing information module 220, when operable within the computing device 210, causes the computing device 210 to, when the second sub-set of encoded data slices is to be requested, send accessing information 152 regarding the second sub-set of encoded data slices. For example, the send accessing information module 220 identifies at least one of the encoded data slices 154 of the second sub-set of encoded data slices such that when combined with the first sub-set of encoded data slices 148 provides a decode threshold number of encoded data slices, generates the accessing information 152 to include the identity of the at least one of encoded data slices 154, and outputs the accessing information 152. The outputting includes sending the accessing information 152 to at least one of the DS processing unit 16 and the potential accessing device 131.

The receive slice module 222, when operable within the computing device 210, causes the computing device 210 to receive, in response to the accessing information 152, at least one of the encoded data slices 154 of the second sub-set of encoded data slices such that the decode threshold number of encoded data slices have been received. The receiving includes receiving the at least one of the encoded data slices 154 from at least one of the DS processing unit 16 and the potential accessing device 131.

The remedy slice error module 224, when operable within the computing device 210, causes the computing device 210 to determine whether one or more of the first sub-set of encoded data slices 148 has a slice error (e.g., detecting a missing slice and/or detecting unfavorable slice integrity), when the slice error exists identify one or more slice names corresponding to the one or more of the first sub-set of encoded data slices having the slice error and request the one or more of the first sub-set of encoded data slices having the slice error from one or more devices of a user group based on the one or more slice names. For example, the remedy slice error module 224 detects a slice error, sends a slice request to the potential accessing device 131, receives a replacement slice from the potential accessing device 131, and stores the replacement slice in the memory 214.

Figure 10B:
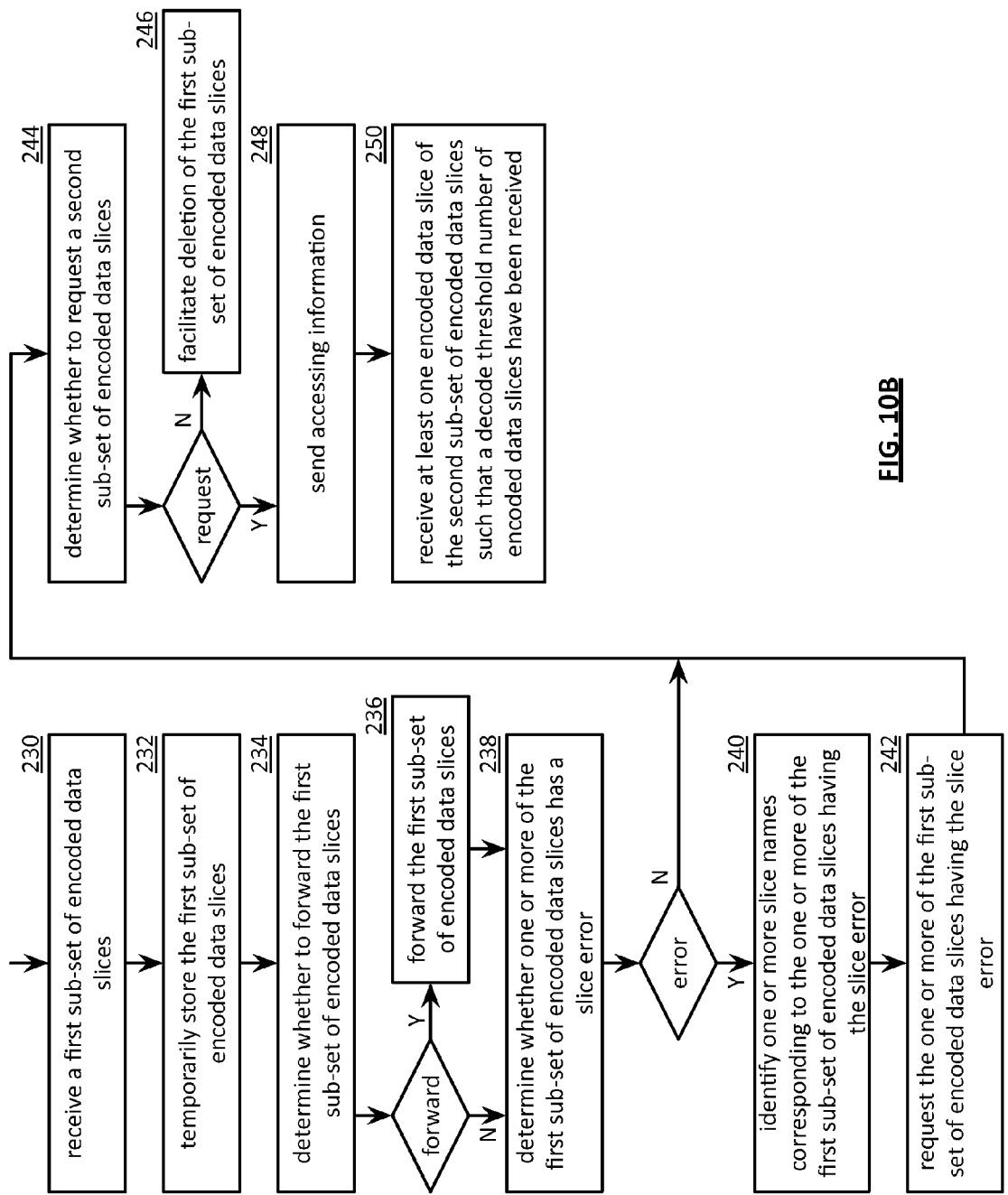
FIG. 10B is a flowchart illustrating another example of acquiring multi-media content in accordance with the present invention.

FIG. 10B is a flowchart illustrating an example of acquiring multi-media content. The method begins at step 230 were a processing module (e.g., of a dispersed storage (DS) module of a potential accessing device) receives a first sub-set of encoded data slices, wherein a data segment of multi-media content was encoded using a dispersed storage error coding function to produce a set of encoded data slices, wherein the set of encoded data slices is partitioned into the first sub-set of encoded data slices and a second sub-set of encoded data slices, and wherein the first sub-set of encoded data slices include less than a decode threshold number of encoded data slices. The receiving the first sub-set of encoded data slices includes receiving a distribution of the first sub-set of encoded data slices to a plurality of potential accessing devices. The receiving the first sub-set of encoded data slices further includes at least one of receiving a message that includes the first sub-set of encoded data slices from at least one of a dispersed storage (DS) processing unit, a user device, another potential accessing device, and an intermediate edge device of a dispersed storage network (DSN). The receiving the first sub-set of encoded data slices further includes receiving the first sub-set of encoded data slices in accordance with a registered user program of a network (e.g., site affiliation registration, system affiliation registration, system access) and sending a request message for the first sub-set of encoded data slices.

The method continues at step 232 where the processing module temporarily stores the first sub-set of encoded data slices prior to sending accessing information with regards to the second sub-set of encoded data slices. The method continues at step 234 where the processing module determines whether to forward one or more of the first sub-set of encoded data slices to a user device (e.g., another potential accessing device of a group of accessing devices that includes the potential accessing device). The determination may be based on one or more of receiving a request, a predetermination, and determining that the user device is likely to acquire the multi-media content. The method branches to step 238 when the processing module determines not to forward the one or more of the first sub-set of encoded data slices to the user device. The method continues to step 236 when the processing module determines to forward the one or more of the first sub-set of encoded data slices to the user device. The method continues at step 236 where the processing module forwards the one or more of the first sub-set of encoded data slices to the user device when forwarding. The method branches to step 238.

The method continues at step 238 where the processing module determines whether one or more of the first sub-set of encoded data slices has a slice error. The method branches to step 244 when the processing module determines that there is no slice error. The method continues to step 240 when the processing module determines that there is a slice error. When the slice error exists, the method continues at step 240 where the processing module identifies one or more slice names corresponding to the one or more of the first sub-set of encoded data slices having the slice error (e.g., from an unfavorable comparison of list responses and/or list digest responses). The method continues at step 242 where the processing module requests the one or more of the first sub-set of encoded data slices having the slice error from one or more devices of a user group based on the one or more slice names. For example, the processing module generates a read slice request that includes the one or more slice names, identifies the one or more user devices of the user group (e.g., a group of affiliated potential accessing devices), outputs the read slice request to the one or more user devices, and receives a read slice response that includes replacement slices for the one or more of the first sub-set of encoded data slices have in a slice error.

The method continues at step 244 where the processing module determines whether to request the second sub-set of encoded data slices. The determining whether to request the second sub-set of encoded data slices includes determining when the multi-media content is available for purchase and when the multi-media content becomes available for purchase, indicating that the second sub-set of encoded data slices is to be requested. The determining whether to request the second sub-set of encoded data slices further includes at least one of determining whether a storage time frame of the first sub-set of encoded data slices has expired and, when the storage time frame has expired, indicating the that the second sub-set of encoded data slices is not going to be requested and determining a probability that the second sub-set of encoded data slices will be requested and, when the probability is likely that the second sub-set of encoded data slices will be requested, indicating that the second sub-set of encoded data slices is to be requested. The method branches to step 248 when the processing module determines the request the second sub-set of encoded data slices. The method continues to step 246 when the processing module determines not to request the second sub-set of encoded data slices. When the second sub-set of encoded data slices is not to be requested, the method continues at step 246 where the processing module facilitates deletion of the first sub-set of encoded data slices.

When the second sub-set of encoded data slices is to be requested, the method continues at step 248 where the processing module sends accessing information regarding the second sub-set of encoded data slices. The sending includes generating the accessing information and outputting the accessing information to at least one of a DS processing unit, a user device, and another potential accessing device. The method continues at step 250 with a processing module receives, in response to the accessing information, at least one of the encoded data slices of the second sub-set of encoded data slices such that the decode threshold number of encoded data slices have been received. The receiving may further include decoding the decode threshold number of encoded data slices to reproduce the data segment of multi-media content. The method may repeat such that a plurality of data segments are reproduced enabling reproduction of the multi-media content for storage and/or consumption.

Figure 11:
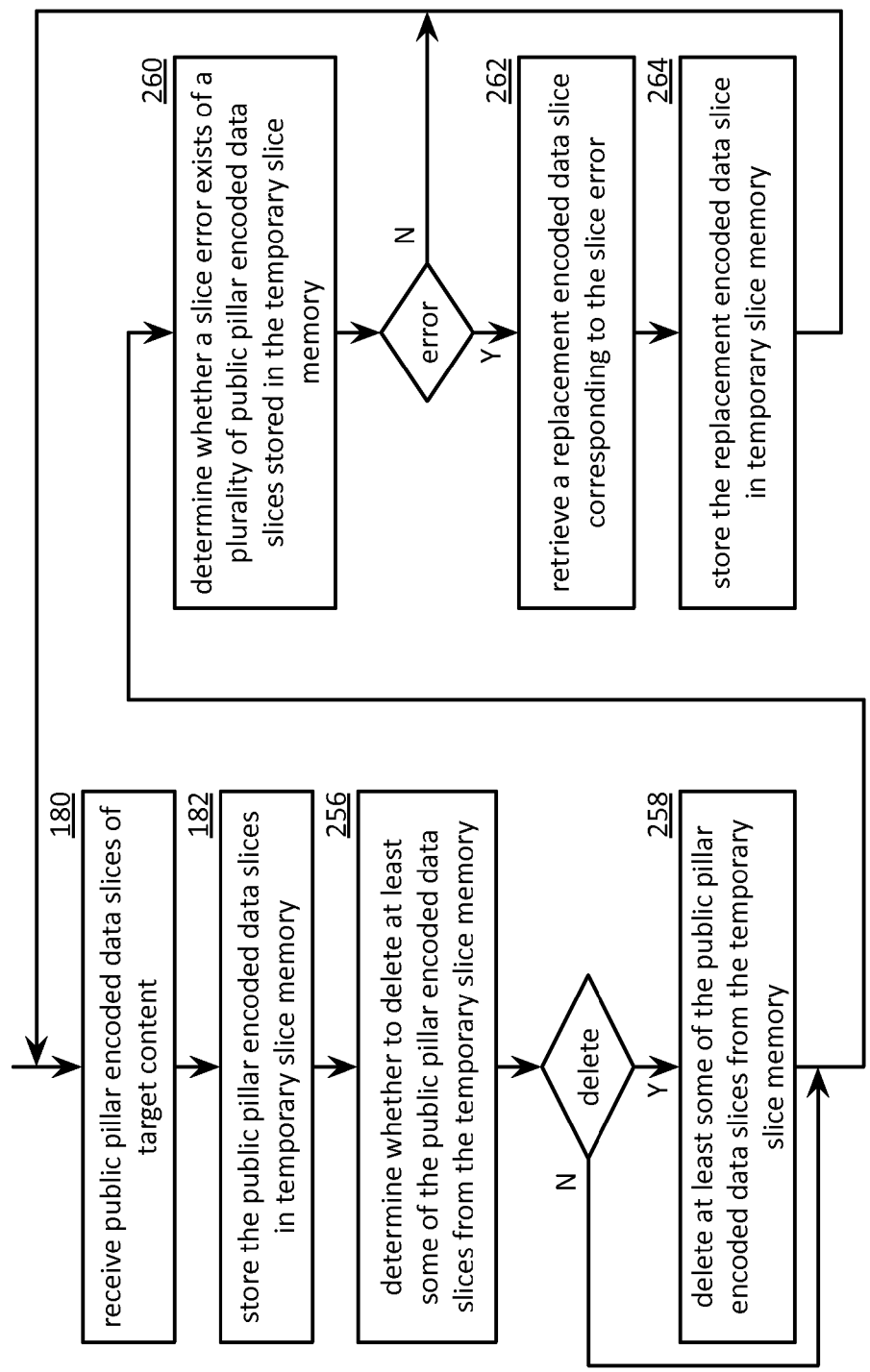
FIG. 11 is a flowchart illustrating an example of maintaining temporarily stored encoded data slices in accordance with the present invention.

FIG. 11 is a flowchart illustrating an example of maintaining temporarily stored encode data slices, which include similar steps to FIG. 8A. The method begins steps 180 and 182 of FIG. 8A where a processing module (e.g., of a user device) receives public pillar encoded data slices of target content and stores the public pillar encoded data slices in a temporary slice memory. The method continues at step 256 where the processing module determines whether to delete at least some of the public pillar encoded data slices from the temporary slice memory. The determination may be based on one or more of an estimation of a likelihood of a full download being desired, a likelihood threshold, previous user selection, a user preference, a predetermination, a target content list, a slice age indicator, an age threshold, a memory capacity indicator, and a memory threshold. For example, the processing module determines to delete the at least some of the public pillar encoded data slices when the estimation of the likelihood of the full download being desired is less than the likelihood threshold. As another example, the processing module determines to delete the at least some of the public pillar encoded data slices when a user preference compares unfavorably to the target content. As another example, the processing module determines to delete the at least some of the public pillar encoded data slices when the slice age indicator is greater than the age threshold. As yet another example, the processing module determines to not delete the at least some of the public pillar encoded data slices when the slice age indicator is greater than the age threshold and the memory capacity indicator is greater than a memory threshold.

The method branches to step 260 when the processing module determines not to delete the at least some of the public pillar encoded data slices. The method continues to step 258 when the processing module determines to delete the at least some of the public pillar encoded data slices. The method continues at step 258 where the processing module deletes the at least some of the public pillar encoded data slices from the temporary slice memory. The deleting may include determining how many pillars to delete based on one or more of the slice age indicator, the memory capacity indicator, a slice size indicator, a number of pillars to delete associated with a time frame indicator, and error coding parameters. For example, the processing module deletes one pillar of encoded public pillar encoded data slices when the number of pillars to delete associated with the time frame indicator indicates to delete one pillar at a first time period. As another example, the processing module deletes all pillars of the encoded public pillar encoded data slices when the number of pillars to delete associated with the time frame indicator indicates to delete all pillars at a maximum time period.

The method continues at step 260 where the processing module determines whether a slice error exists of a plurality of public pillar encoded data slices stored in the temporary slice memory. The slice error includes at least one of a missing slice, a corporate slice (e.g., detected by an unfavorable comparison of a calculated integrity check value to a retrieved integrity check value of an encoded data slice), and a number of stored slices corresponding to allowed pillars is less than a number of allowed pillars. The determining may be based on one or more of a query, an integrity test, an error message, an allowed number of pillars, a pillar assignment, and a comparison of a slice name list to a second slice name list. For example, processing module determines a slice error exists when 7 public pillar encoded data slices of a set of encoded data slices are stored in the temporary slice memory and the pillar assignment includes allowing a storage of 9 public pillar encoded data slices of a set of encoded data slices. In such an example, two public pillar encoded data slices may have been previously deleted. The method repeats back to step 180 when the processing module determines that the slice error does not exist. The method continues to step 262 when the processing module determines that the slice error exists.

The method continues at step 262 where the processing module retrieves a replacement encode data slice corresponding to the slice error. The retrieving includes retrieving the encoded data slice from at least one of a dispersed storage network (DSN) memory, an edge network unit, and from another user device. The replacement encoded data slice may correspond to a same pillar number associated with the slice error or a different pillar number (e.g., that same set of slices) when such a different pillar number is included in the pillar assignment. The method continues at step 264 where the processing module stores the replacement encoded data slice in the temporary slice memory. The method repeats back to step 180.

Figure 12B:
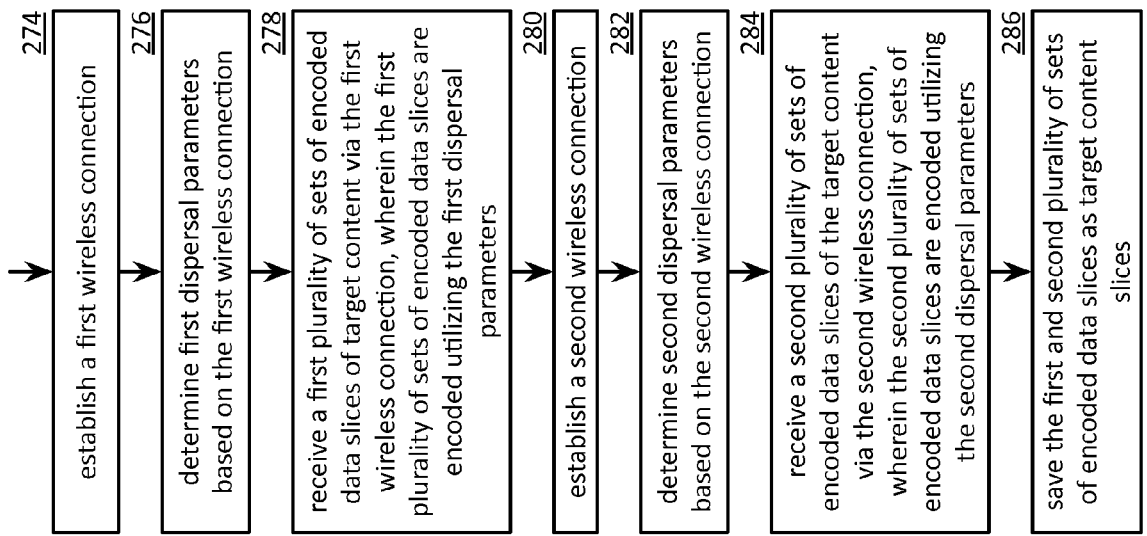
FIG. 12B is a flowchart illustrating an example of communicating encoded data slices via a wireless connection in accordance with the present invention.
Figure 12A:
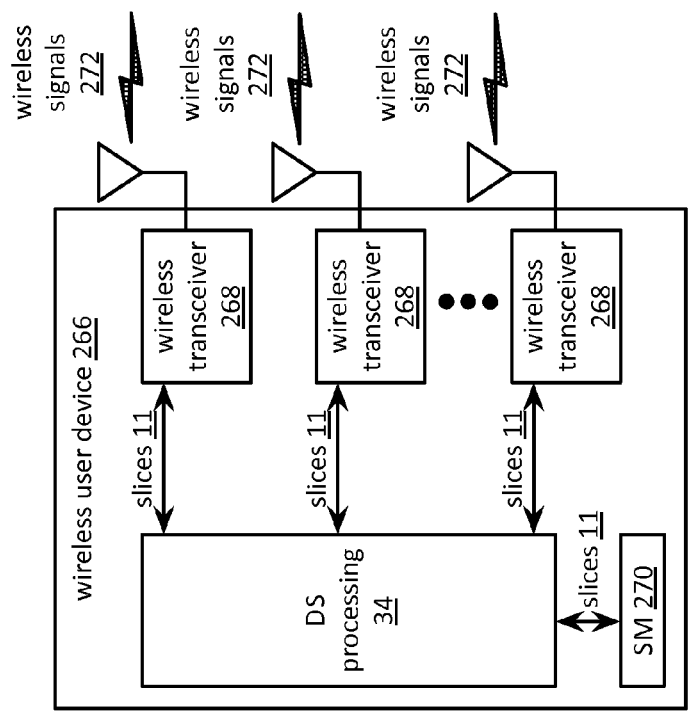
FIG. 12A is a schematic block diagram of an embodiment of a wireless user device in accordance with the present invention.

FIG. 12A is a schematic block diagram of an embodiment of a wireless user device 266 that includes a dispersed storage (DS) processing 34, a slice memory 270 (e.g., including at least one of a temporary slice memory and a non-temporary slice memory), and a plurality of wireless transceivers 268. Each wireless transceiver 268 transmits and receives wireless signals 272 in accordance with one or more industry standards (e.g. global system for mobile communications (GSM), code division multiple access (CDMA) etc.

The wireless user device 266 establishes one or more wireless connections (e.g., sending and receiving wireless signals 272 with at least one other wireless device) to form a communications path to receive encoded data slices 11 for storage in the slice memory 270. The other wireless device includes one or more of another wireless user device 266, a base station, a wireless router, and a wireless transceiver. The communications path may include one or more wireless connections. For example, a 100 kb per second communications path may include a 75 kb per second wireless connection on a first wireless transceiver 268 and a 25 kb per second wireless connection on a second wireless transceiver 268. The encoded data slices 11 may include public pillar encoded data slices 11 and private pillar encoded data slices 11. The storage of encoded data slices 11 includes storing public pillar encoded data slices 11 in the temporary memory of the slice memory 270 and storing private pillar encoded data slices 11 in the non-temporary memory of the slice memory 270.

The wireless user device 266 may receive the public pillar encoded data slices 11 and the private pillar encoded data slices 11 from different sources utilizing different wireless signals 272. For example, the wireless user device 266 receives public pillar encoded data slices 11 via the first wireless transceiver 268 and private pillar encoded data slices 11 via the second wireless transceiver 268. A method of operation of the wireless user device 266 is described in greater detail with reference to FIG. 12B.

FIG. 12B is a flowchart illustrating an example of communicating encoded data slices via a wireless connection. The method begins at step 274 where a processing module (e.g., of a wireless user device) establishes a first wireless connection. The establishing includes receiving and/or transmitting wireless signals with at least one other wireless device such that at least a portion of a communications path is established between the processing module and the other wireless device.

The method continues at step 276 where the processing module determines first dispersal parameters based on the first wireless connection. The dispersal parameters of the first dispersal parameters includes at least one of a pillar width, a write threshold, a read threshold, a decode threshold, and an error coding matrix. The determining may be based on wireless signal parameters of the first wireless connection including one or more of an error rate, an error rate threshold, a communications path bandwidth, a bandwidth threshold, an information transfer latency, a latency threshold, a communications path speed (e.g., bits per second), and a speed threshold. For example, the processing module determines a pillar width and decode threshold with an above average difference when the error rate is greater than the error threshold. As another example, the processing module determines a lower than average pillar width when the communications path speed is less than the speed threshold.

The method continues at step 278 where the processing module receives a first plurality of sets of encoded data slices of target content via the first wireless connection, wherein the first plurality of sets of encoded data slices are encoded utilizing the first dispersal parameters. The receiving may include sending the first dispersal parameters to another wireless device associated with the first wireless connection for utilization in encoding the slices.

The method continues at step 280 where the processing module establishes a second wireless connection. For example, the processing module establishes a new wireless connection as the second wireless connection. As another example, the processing module establishes the first wireless connection as the second wireless connection. The method continues at step 282 where the processing module determines second dispersal parameters based on the second wireless connection. The determining may be based on wireless signal parameters of the second wireless connection including one or more of an error rate, an error rate threshold, a communications path bandwidth, a bandwidth threshold, an information transfer latency, a latency threshold, a communications path speed (e.g., bits per second), and a speed threshold.

The method continues at step 284 where the processing module receives a second plurality of sets of encoded data slices of target content via the second wireless connection, wherein the second plurality of sets of encoded data slices are encoded utilizing the second dispersal parameters. The receiving may include sending the second dispersal parameters to another wireless device associated with the second wireless connection for utilization in encoding the slices.

The method continues at step 286 where the processing module saves the first and second plurality of sets of encoded data slices as target content slices. The saving includes storing the first and second plurality of sets of encoded data slices in a temporary slice memory. In addition, the processing module may dispersed storage error decode the plurality of sets of encoded data slices utilizing the first and second dispersal parameters to reproduce the target content.

Figure 13:
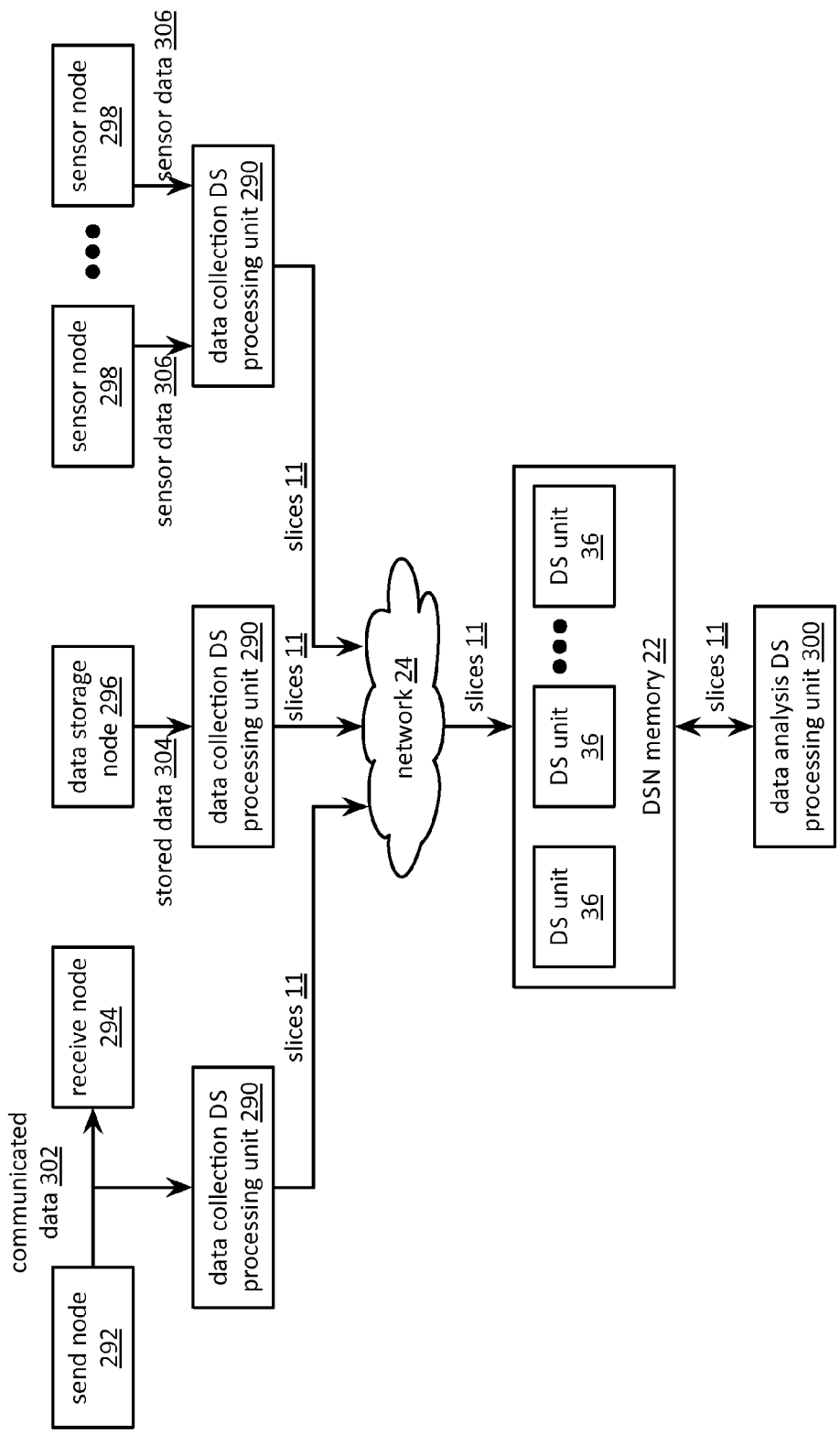
FIG. 13 is a schematic block diagram of another embodiment of a computing system in accordance with the present invention.

FIG. 13 is a schematic block diagram of another embodiment of a computing system that includes a plurality of data collection dispersed storage (DS) processing units 290, a send node 292, a receive node 294, a data storage node 296, a plurality of sensor nodes 298, a network 24, a dispersed storage network (DSN) memory 22, and a data analysis DS processing unit 300. The DSN memory 22 includes a plurality of DS units 36. The send node 292, receive node 294, data storage node 296, and plurality of sensor nodes 298 may include a portable or fixed communications and/or computing device and may be implemented utilizing one or more of a computing core, a wireless interface, a wireline interface, a user interface, a memory unit, a disk drive, and a memory device. The sensor node 298 may include one or more sensors implemented to sense one or more of environmental conditions, motion, radar reflections, communications traffic levels, recognize images, recognize patterns, recognize speech, and recognize keyword detections.

Each data collection DS processing unit 290 of the plurality of data collection DS processing units 290 is operable to select data in accordance with a data selection method (e.g., based on a data type, a data priority indicator, a data bandwidth, available memory, available bandwidth to the DSN memory), receive data for storage (e.g., communicated data, stored data, such a data), establish dispersed storage error coding function parameters (e.g., based on a data type, a data priority indicator, a data bandwidth, available memory, available bandwidth to the DSN memory), dispersed storage error encode the data utilizing a dispersed storage error coding function in accordance with the dispersed storage error coding function parameters to produce a plurality of slices 11, establish a priority indicator and a timestamp associated with the data (e.g., time & date of arrival), and send the slices 11, the priority indicator, and the timestamp to the DSN memory 22 for storage therein. The data includes at least one of communicated data 302 transmitted from the send node 292 to at least one receive node 294, stored data 304 received from the data storage node 296, and sensor data 306 from one or more of the plurality of sensor nodes 298. The communicated data 302 includes at least one of wireline communications and wireless communications to communicate data including multimedia, video, audio, and data files. The stored data 304 includes one or more of multimedia, video, audio, and data files. The sensor data 306 includes one or more of sensed patterns, sensed variable levels, and raw sensor data.

The priority indicator may be utilized to prioritize a timeframe of data retention of the data. For example, a high priority level of the priority indicator for data indicates that the data shall be retained for a longer than average timeframe and perhaps indefinitely. As another example, a low priority level of the priority indicator for data indicates that the data shall be retained for a minimum and shorter than average timeframe. The priority indicator may be associated with data and/or each slice of the plurality of slices 11 of the data. For example, a slice with a high priority level that is associated with data of a low priority level shall be retained for a longer than average timeframe. As another example, a slice with a low priority level that is associated with data of a high priority level shall be retained for a longer than average timeframe. As yet another example, a slice with a low priority level that is associated with data of a low priority level shall be retained for a shorter than average timeframe.

A DSN directory may include a pathname field, a data priority indicator field, and a source name field, wherein the data priority indicator field includes a data priority indicator entry signifying a priority level associated with data of a pathname entry in the pathname field stored in the DSN memory utilizing a source name address entry of the source name field. A slice name field may include a slice priority indicator field, wherein an associated slice priority indicator entry signifies a priority level associated with a slice of a corresponding slice name. The slice name of the slice name field may be communicated between the data collection DS processing unit 290, the DSN memory 22, and the data analysis DS processing unit 300.

The DSN memory 22 may include a significant number of DS units 36 to create a storage system of massive scale (e.g., tens of thousands of exabytes). Each DS unit 36 of the DSN memory 22 is operable to receive (e.g., from a data collection DS processing unit 290) one or more of a slice of the plurality of slices 11, a slice name of the slice, a data priority indicator (e.g., for data associated with the slice), a slice priority indicator, and a timestamp; store one or more of the slice, the slice name, the data priority indicator, the slice priority indicator, and the timestamp in a local memory of the DS unit 36; delete the slice from the local memory based on a slice deletion method; rebuild the slice when a slice error is detected associated with the slice; and outputting one or more of the slice, the slice name, the data priority indicator, the slice priority indicator, and the timestamp in response to a retrieval request (e.g., from the data analysis DS processing unit). A method of operation to capture data slices 11, store the slices 11, delete slices 11, and rebuild slices 11 of the system is discussed in greater detail with reference to FIGS. 14A-17B.

The data analysis DS processing unit 300 is operable to retrieve (e.g., from the DSN memory 22) one or more of slices 11 of the plurality of slices 11, the slice name of the slice, the data priority indicator, the slice priority indicator, and the timestamp; dispersed storage error decode the slices 11 to reproduce data in accordance with error coding dispersal parameters; facilitate analysis of the data to produce a data analysis; store the data analysis in the DSN memory 22; and establish a modified data priority indicator and/or a modified slice priority indicator based on the data analysis. The data analysis DS processing unit 300 is further operable to store the modified data priority indicator and/or the modified slice priority indicator in the DSN memory 22; facilitate deletion of a slice of the plurality slices 11 from the DSN memory based on the slice deletion method; rebuild a slice when a slice error is detected associated with the slice; and output one or more of the data, the data analysis, the plurality slices 11, the slice name, the data priority indicator, the modified data priority indicator, the slice priority indicator, the modified slice priority indicator, and the timestamp in response to a retrieval request (e.g., from a user device associated with the data analysis DS processing unit). Alternatively, the data collection DS processing unit 290 may be utilized to implement the data analysis DS processing unit 300. A method of operation of the data analysis DS processing unit 300 is discussed in greater detail with reference to FIGS. 14A-17B.

In an example of operation, a text file is received as communicated data 3 to 2 by a data collection DS processing unit 290. The data collection DS processing unit 290 establishes dispersed storage error coding function parameters to include a pillar width of 16 and a decode threshold of 10 based on a lookup of default error coding dispersal parameters for a text file. The data collection DS processing unit 290 dispersed storage error encodes the text file in accordance with the dispersed storage error coding function parameters to produce a plurality of text slices 11. The data collection DS processing unit 290 generates a plurality of slice names corresponding to the plurality of text slices 11. The data collection DS processing unit 290 establishes a priority indicator level of 5 based on a lookup for a default priority level for a text file and establishes a timestamp of a current system time and date. The data collection DS processing unit 290 sends the plurality of text slices 11, the plurality of slice names, the priority indicator level of 5, and the timestamp to the DSN memory 22 for storage therein.

In the example of operation continued, a DS unit 36 of the plurality of DS units 36 determines to delete a text slice 11 of the plurality of text slices 11, wherein the text slice 11 is associated with a slice priority level of 2 and a timestamp that compares unfavorably to a current timestamp (e.g., an amount of elapsed time since the timestamp is greater than a time threshold). Next, the DS unit 36 deletes the text slice 11. The deletion lowers a number of retrievable pillar slices by one but may not lower the number below the decode threshold of 10.

In the example of operation continued, the data analysis DS processing unit 300 retrieves (e.g., from the DSN memory 22) a decode threshold number of text slices of each data segment of the plurality of text slices, the data priority indicator of 5, and the timestamp. The data analysis DS processing unit 300 dispersed storage error decodes the decode threshold number of text slices 11 of each data segment of the plurality of text slices 11 to reproduce the text file in accordance with dispersed storage error coding function parameters. The data analysis DS processing unit 300 facilitates analysis of the text file to produce a data analysis. The data analysis DS processing unit establishes a modified data priority indicator of 8 based on the data analysis and stores the modified data priority indicator of 8 in the DSN memory 22.

Figure 14A:
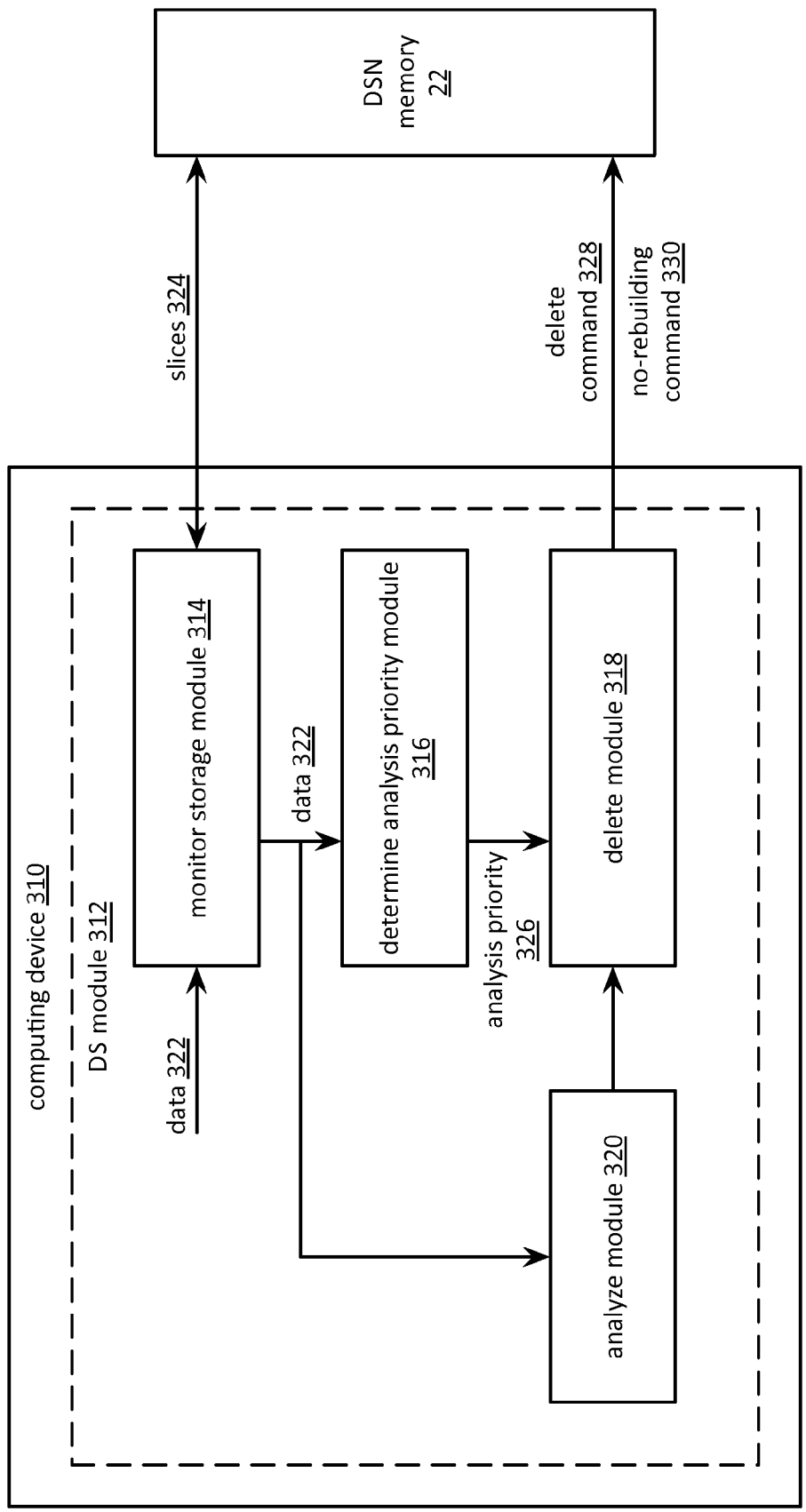
FIG. 14A is a schematic block diagram of another embodiment of a computing system in accordance with the present invention.

FIG. 14A is a schematic block diagram of another embodiment of a computing system that includes a computing device 310 and a dispersed storage network (DSN) memory 22. The computing device 310 may be implemented as at least one of a data collection dispersed storage (DS) processing unit, a data analysis DS processing unit, a DS processing unit, a DS unit, and a user device. The computing device 310 includes a DS module 312. The DS module 312 includes a monitor storage module 314, a determine analysis priority module 316, a delete module 318, and an analyze module 320.

The monitor storage module 314, when operable within the computing device 310, causes the computing device 310 to monitor storage of data 322, wherein the data 322 is encoded using a dispersed storage error coding function to produce a plurality of sets of encoded data slices 324 and is stored as the plurality of sets of encoded data slices 324 in the DSN memory 22. Alternatively, the monitor storage module 314 is further operable to encode the data utilizing the dispersed storage error coding function to produce the plurality of sets of encoded data slices 324 and store the plurality of sets of encoded data slices 324 in the DSN memory 22.

The monitor storage module 314 is further operable to determine a data characterization of the data 322, wherein the data characterization includes at least one of a time factor (e.g., when ingested, when stored), a data source factor (e.g., a sending entity), a data content factor (e.g., a data type indicator, a data identifier (ID)), and a data location origination factor (e.g., a sourcing entity). The determine analysis priority module 316, when operable within the computing device 310, causes the computing device 310 to determine analysis priority 326 of the data 322 in accordance with an analysis prioritization protocol. The analysis priority protocol includes at least one of a time based scaling factor, a data source based scaling factor, a data content based scaling factor, and a data location origination based scaling factor, wherein the analysis priority protocol is a function of the scaling factors.

The monitor storage module 314 is further operable to determine a priority level of the data 322 based on the data characterization and the analysis priority protocol and select parameters for the dispersed storage error coding function based on the priority level. For example, the monitor storage module 314 selects a decode threshold number of 3 and a pillar width of 4 when the priority level indicates a higher than average priority level (e.g., few slices to delete since data analysis is expected soon after storage). As another example, the monitor storage module 314 selects a decode threshold number of 20 and a pillar width of 32 when the priority level indicates a lower than average priority level (e.g., more slices to delete as time goes on). The determining of the priority level of the data 322 may further include generating an initial priority level and storing the initial priority level. The initial priority level may include one or more of the data characterization, the analysis priority protocol, the parameters for the dispersed storage error coding function, and a priority level number.

The delete module 318, when operable within the computing device 310, causes the computing device 310 to, when the analysis priority 326 of the data 322 compares unfavorably to a first priority threshold, issue a command 328 to delete an encoded data slice from each set of at least some of the plurality of sets of encoded data slices 324. The delete module 318 is further operable to, when the analysis priority 326 of the data 322 compares unfavorably to a second priority threshold, issue a second command to delete the encoded data slice and at least one other encoded data slice from each set of the at least some of the plurality of sets of encoded data slices 324.

The delete module 318 is further operable to determine, in accordance with the analysis prioritization protocol, that analysis of the data is no longer desired and when the analysis of the data is no longer desired, issue another command to delete the plurality of sets of encoded data slices 324. The delete module 318 is further operable to, when the analysis priority of the data 322 compares unfavorably to the first priority threshold, issue a no-rebuilding command 330 regarding the encoded data slices from each set of the at least some of the plurality of sets of encoded data slices 324 (e.g., indicating that the one or more encoded data slices do not require rebuilding) and update parameters of the dispersed storage error coding function to reflect the deletion of encoded data slices from each set of the at least some of the plurality of sets of encoded data slices 324 (e.g., lower a pillar width in a registry for an associated vault and object number).

The analyze module 320, when operable within the computing device 310, causes the computing device 310 to analyze the data 322. The delete module 318 is further operable to determine, based on the analyzing the data, that the data 322 can be deleted and when the data 322 can be deleted, issue yet another command to delete the plurality of sets of encoded data slices 324.

Figure 14B:
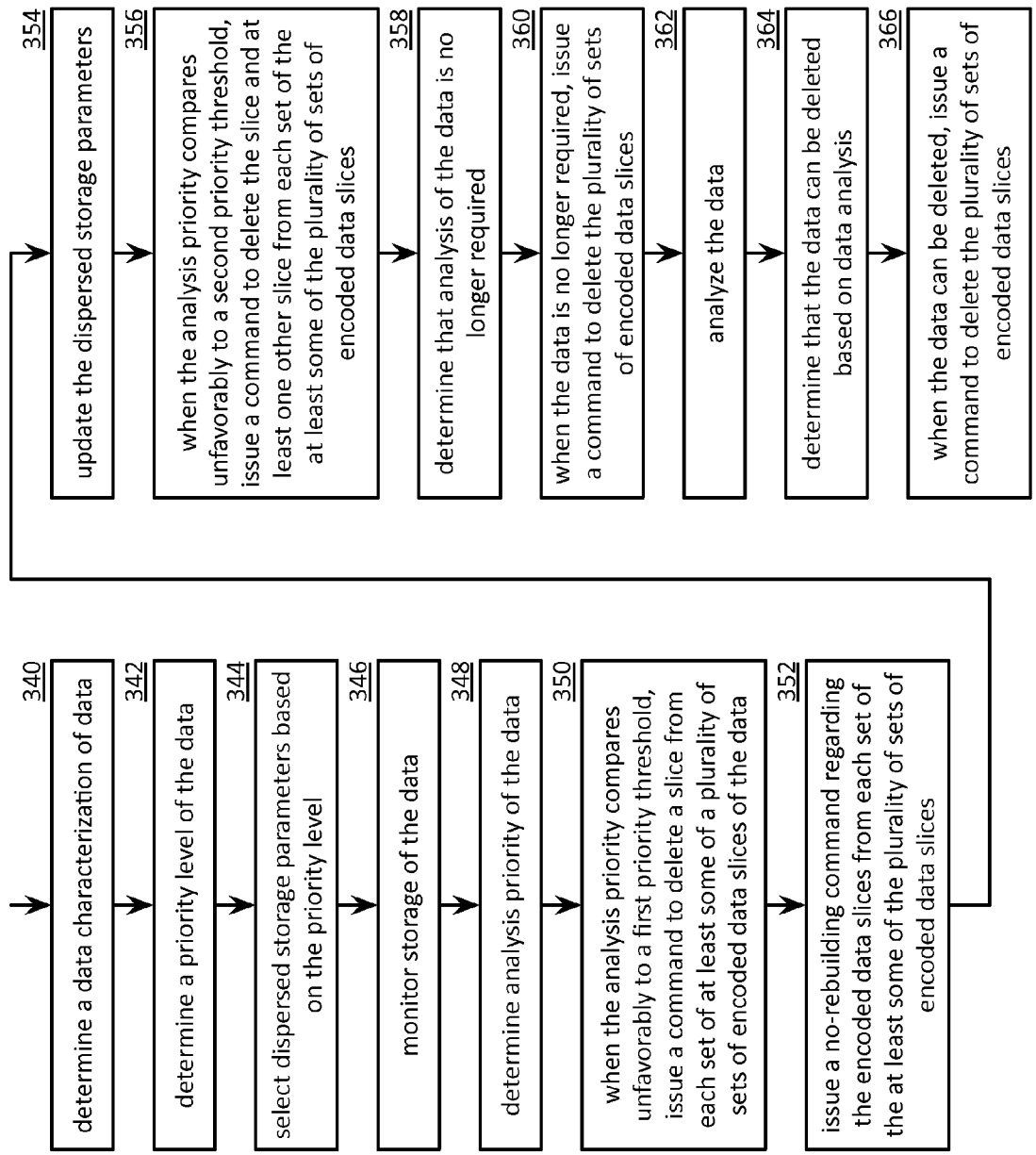
FIG. 14B is a flowchart illustrating an example of deleting data stored in a dispersed storage network (DSN) in accordance with the present invention.

FIG. 14B is a flowchart illustrating an example of deleting data stored in a dispersed storage network (DSN). The method begins at step 340 where a processing module (e.g., of a data analysis dispersed storage (DS) processing unit) determines a data characterization of data, wherein the data characterization includes at least one of a time factor, a data source factor, a data content factor, and a data location origination factor. The method continues at step 342 where the processing module determines a priority level of the data based on the data characterization and an analysis priority protocol. The analysis priority protocol includes one or more of a time based scaling factor, a data source based scaling factor, a data content based scaling factor, and a data location origination based scaling factor, wherein the analysis priority protocol is a function of the scaling factors. The method continues at step 344 where the processing module selects parameters for the dispersed storage error coding function based on the priority level.

The method continues at step 346 for the processing module monitors storage of data, wherein the data is encoded using a dispersed storage error coding function to produce a plurality of sets of encoded data slices and is stored as the plurality of sets of encoded data slices. The method continues at step 348 where the processing module determines analysis priority of the data in accordance with the analysis prioritization protocol. When the analysis priority of the data compares unfavorably to a first priority threshold, the method continues at step 350 where the processing module issues a command to delete an encoded data slice from each set of at least some of the plurality of sets of encoded data slices. For example, the processing module issues a command to delete one encoded data slice from each set of the plurality of sets of encoded data slices when the analysis priority is less than the first priority threshold and at least a decode threshold number of encoded data slices will remain in each set of the plurality of sets of encoded data slices after deleting the one encoded data slice.

The method continues at step 352 where the processing module issues a no-rebuilding command regarding the encoded data slices from each set of the at least some of the plurality of sets of encoded data slices. For example, processing module sends the no-rebuilding command to a DSN memory associated with storage of the plurality of sets of encoded data slices. As another example, the processing module sends the no-rebuilding command to one or more DS processing units associated with the DSN memory. As yet another example, the processing module sends the no-rebuilding command to a storage integrity processing unit associated with the DSN.

A method continues at step 354 where the processing module updates parameters of the dispersed storage error coding function to reflect the deletion of encoded data slices from each set of the at least some of the plurality of sets of encoded data slices. For example, the processing module updates a registry associated with the data to indicate a lowered pillar width number. When the analysis priority of the data compares unfavorably to a second priority threshold, the method continues at step 356 where the processing module issues another command to delete the encoded data slice and at least one other encoded data slice from each set of the at least some of the plurality of sets of encoded data slices.

The method continues at step 358 where the processing module determines, in accordance with the analysis prioritization protocol, that analysis of the data is no longer desired. For example, the processing module indicates that analysis of the data is no longer desired when too much time has expired since storage of the data without analysis. As another example, the processing module indicates that analysis of the data is no longer required when receiving a message that the data is no longer of interest. When the analysis of the data is no longer desired, the method continues at step 360 where the processing module issues a yet another command to delete the plurality of sets of encoded data slices.

The method continues at step 362 where the processing module analyzes the data. The analyzing includes one or more of searching the data to match a search term, counting a number of occurrences of a character string, identifying a correlation of a source of the data to a previous known data source, identifying a data pattern, determining whether the data may be deleted, and identifying a data element of interest based on a list of previously identified data elements of interest. The method continues at step 364 where the processing module determines, based on the analyzing the data, whether the data can be deleted. For example, the processing module determines that the data can be deleted when searching the data to match the search term revealed no matches. When the data can be deleted, the method continues at step 366 where the processing module issues a still further command to delete the plurality of sets of encoded data slices.

Figure 15:
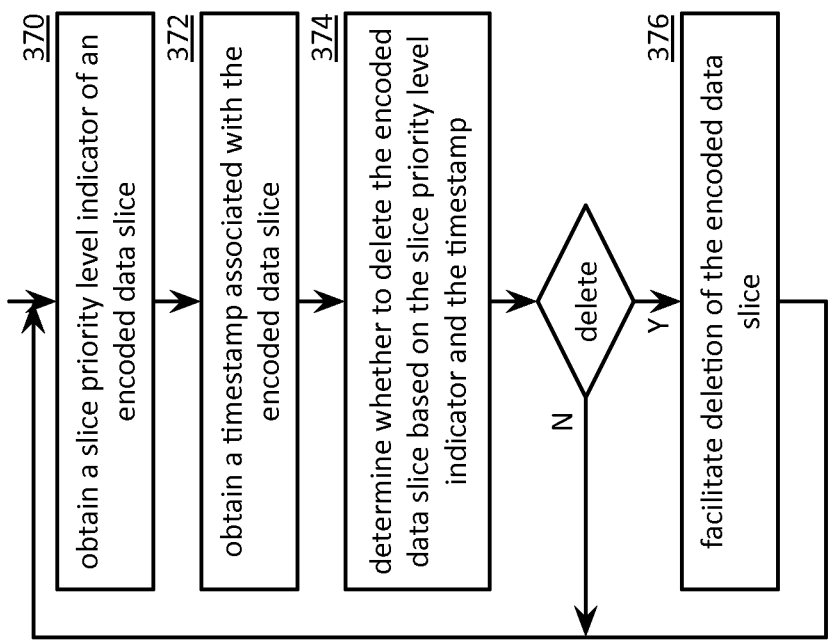
FIG. 15 is a flowchart illustrating an example of deleting data stored in a dispersed storage network (DSN) in accordance with the present invention.

FIG. 15 is a flowchart illustrating an example of deleting data stored in a dispersed storage network (DSN). The method begins at step 370 where a processing module (e.g., a dispersed storage (DS) processing unit, a DS unit) obtains a slice priority level indicator of an encoded data slice. The obtaining includes at least one of retrieving the priority level indicator from a DS unit that stores the encoded data slice, retrieving the priority level indicator from a DSN directory, and receiving the priority level indicator. The method continues at step 372 where the processing module obtains a timestamp associated with the encoded data slice. The obtaining includes at least one of retrieving the timestamp from the DS unit that stores the encoded data slice, retrieving the timestamp from a DSN directory, and receiving the timestamp.

The method continues at step 374 where the processing module determines whether to delete the encoded data slice based on at least one of the slice priority level indicator and the timestamp. For example, the processing module determines to delete the encoded data slice when an amount of elapsed time since the timestamp is greater than a time threshold corresponding to the slice priority level. For instance, the processing module determines to delete the encoded data slice when 30 days has elapsed since the timestamp, the time threshold is 30 days, and the slice priority level is 3. As another instance, the processing module determines not to delete the encoded data slice when 45 days has elapsed since the timestamp, a time threshold is infinite, and the slice priority level is 10. As yet another instance, the processing module determines to delete the encoded data slice when zero days has elapsed since the timestamp, a time threshold is 0, and the slice priority level is 0.

The method repeats back to step 370 when the processing module determines not to delete the encoded data slice. The method continues to step 376 when the processing module determines to delete the encoded data slice. The method continues at step 376 where the processing module facilitates deletion of encoded data slice. The facilitating includes at least one of sending a delete request message to the DS unit associated with encoded data slice that includes a slice name of encoded data slice when the processing module is associated with a DS processing unit and deleting the encoded data slice when the processing module is associated with the DS unit. The method repeats back to step 370.

Figure 16:
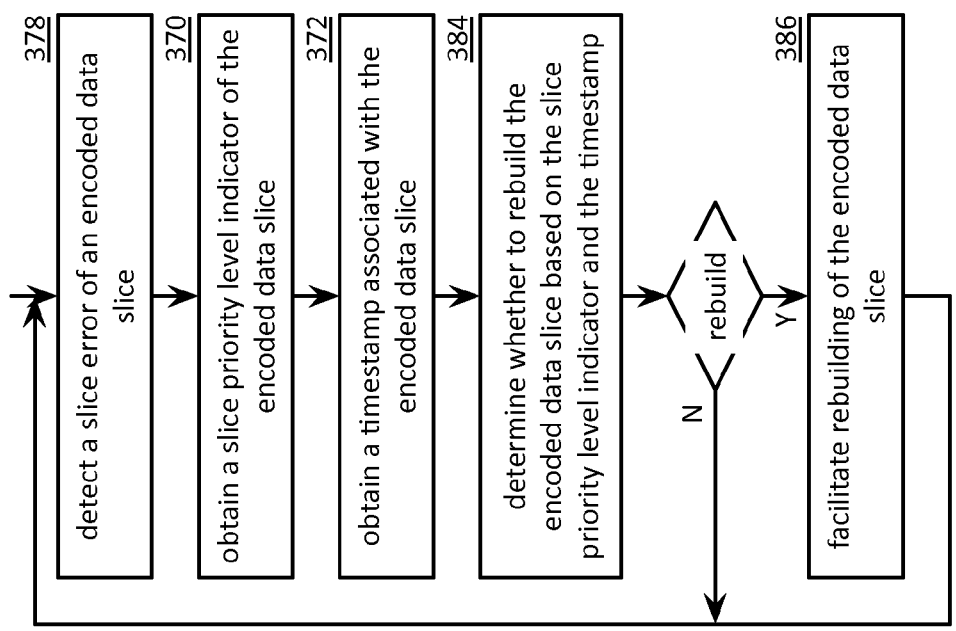
FIG. 16 is a flowchart illustrating an example of rebuilding data stored in a dispersed storage network (DSN) in accordance with the present invention.

FIG. 16 is a flowchart illustrating an example of rebuilding data stored in a dispersed storage network (DSN), which includes similar steps to FIG. 15. The method begins at step 378 where a processing module (e.g., a dispersed storage (DS) processing unit, a DS unit) detects a slice error of an encoded data slice. The detecting includes at least one of detecting a missing slice, detecting a slice that fails an integrity check, and setting an error flag corresponding to a slice name of the encoded data slice. The method continues with steps 370-372 of FIG. 15 where the processing module obtains a slice priority level indicator of the encoded data slice and obtains a timestamp associated with the encoded data slice.

The method continues at step 384 where the processing module determines whether to rebuild the encoded data slice based on the slice priority level indicator and the timestamp. For example, the processing module determines to rebuild the encoded data slice when an amount of elapsed time since the timestamp is less than a time threshold corresponding to the slice priority level. For instance, the processing module determines to rebuild the encoded data slice when 20 days has elapsed since the timestamp, the time threshold is 30 days, and the slice priority level is 3. As another instance, the processing module determines not to rebuild the encoded data slice when 45 days has elapsed since the timestamp, the time threshold is 30, and the slice priority level is 9. As yet another instance, the processing module determines to rebuild the encoded data slice when 1 day has elapsed since the timestamp, a time threshold is 10, and the slice priority level is 1. The method repeats back to step 378 when the processing module determines not to rebuild the encoded data slice. The method continues to step 386 when the processing module determines to rebuild the encoded data slice.

The method continues at step 386 where the processing module facilitates rebuilding of the encoded data slice. The facilitating includes at least one of sending a rebuild request message to the DS unit associated with encoded data slice that includes a slice name of encoded data slice when the processing module is associated with a DS processing unit and rebuilding the encoded data slice when the processing module is associated with the DS unit. The rebuilding includes at least one of retrieving a decode threshold number of encoded data slices associated with the encoded data slice, decoding the least the decode threshold number of encoded data slices to produce a data segment, encoding the data segment to produce a rebuilt encoded data slice, storing the rebuilt encoded data slice, and resetting the error flag corresponding to the slice name of the encoded data slice. The method repeats back step 378.

Figure 17B:
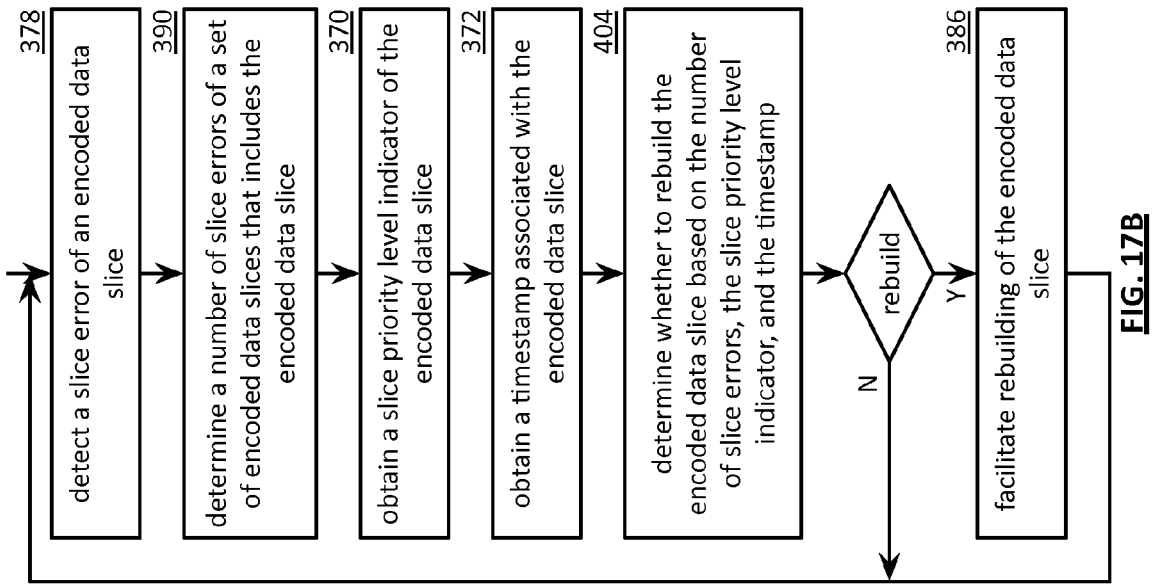
FIG. 17B is a flowchart illustrating another example of rebuilding data stored in a dispersed storage network (DSN) in accordance with the present invention.
Figure 17A:
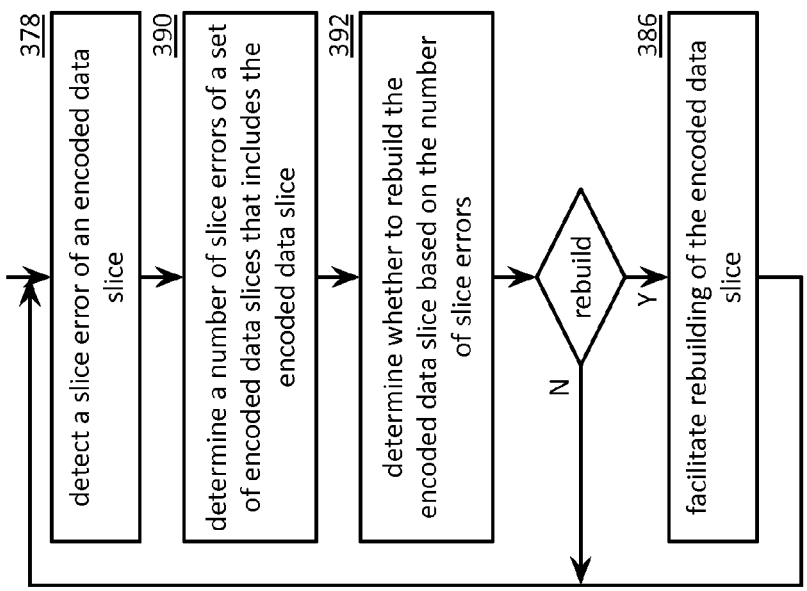
FIG. 17A is a flowchart illustrating another example of rebuilding data stored in a dispersed storage network (DSN) in accordance with the present invention.

FIG. 17A is a flowchart illustrating another example of rebuilding data stored in a dispersed storage network (DSN), which includes similar steps to FIG. 16. The method begins with step 378 of FIG. 16 where a processing module (e.g., a dispersed storage (DS) processing unit, a DS unit) detects a slice error of an encoded data slice. The method continues at step 390 where the processing module determines a number of slice errors of a set of encoded data slices that includes the encoded data slice. The determining may be based on one or more of obtaining slice names of the set of encoded data slices based on a slice name of the encoded data slice, querying DS units associated with the set of encoded data slices, and retrieving one or more slice error flags associated with the set of encoded data slices.

The method continues at step 392 where the processing module determines whether to rebuild the encoded data slice based on the number of slice errors. The determining may be based on one or more of comparing the number of slice errors to an error threshold, determining whether the comparison is favorable, and indicating to rebuild when the comparison is not favorable. For example, the processing module determines that the comparison is favorable when the number of slice errors is greater than the error threshold. The error threshold may range from one to n-k, wherein n=a pillar width and k=a decode threshold. For example, the error threshold may be set to just one slice error to provide a higher level of reliability. As another example, the error threshold may be set to 6 (e.g., 6=n-k, when the pillar width=16 and the decode threshold=10) to avoid utilizing system resources to rebuild the encoded data slice.

The method repeats back to step 378 of FIG. 16 when the processing module determines to not to rebuild the encoded data slice. The method continues to step 386 of FIG. 16 when the processing module determines to rebuild the encoded data slice. The method continues at step 386 of FIG. 16 where the processing module facilitates rebuilding of the encoded data slice. The method repeats back to step 378 of FIG. 16 where the processing module detects the slice error to look for further errors.

FIG. 17B is a flowchart illustrating another example of rebuilding data stored in a dispersed storage network (DSN), which includes similar steps to FIGS. 15, 16, and 17A. The method begins with step 378 of FIG. 16 where a processing module (e.g., a dispersed storage (DS) processing unit, a DS unit) detects a slice error of an encoded data slice. The method continues with step 390 of FIG. 17A where the processing module determines a number of slice errors of a set of encoded data slices that includes the encoded data slice. The method continues with steps 370-372 of FIG. 15 where the processing module obtains a slice priority level indicator of the encoded data slice and obtains a timestamp associated with the encoded data slice.

The method continues at step 404 where the processing module determines whether to rebuild the encoded data slice based on the number of slice errors, the slice priority level indicator, and the timestamp. For example, the processing module determines to rebuild the encoded data slice when the number of slice errors is greater than a rebuild threshold corresponding to the slice priority level and an amount of elapsed time since the timestamp is less than a time threshold corresponding to the priority level. The method repeats back to step 378 of FIG. 16 when the processing module determines not rebuild the encoded data slice. The method continues to step 386 of FIG. 16 when the processing module determines to rebuild the encoded data slice. The method continues with step 386 of FIG. 16 where the processing module facilitates rebuilding of the encoded data slice. The method repeats back to step 378 of FIG. 16 to look for further errors.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A method comprises:
   monitoring storage of data, wherein the data is encoded using a dispersed storage error coding function to produce a plurality of sets of encoded data slices and is stored as the plurality of sets of encoded data slices;
   determining analysis priority of the data in accordance with an analysis prioritization protocol; and
   when the analysis priority of the data compares unfavorably to a first priority threshold, issuing a command to delete an encoded data slice from each set of at least some of the plurality of sets of encoded data slices.

2. The method of claim 1 further comprises:
   when the analysis priority of the data compares unfavorably to a second priority threshold, issuing a second command to delete the encoded data slice and at least one other encoded data slice from each set of the at least some of the plurality of sets of encoded data slices.

3. The method of claim 1 further comprises:
   determining, in accordance with the analysis prioritization protocol, that analysis of the data is no longer desired; and
   when the analysis of the data is no longer desired, issuing a second command to delete the plurality of sets of encoded data slices.

4. The method of claim 1 further comprises:
   analyzing the data;
   determining, based on the analyzing the data, whether the data can be deleted; and
   when the data can be deleted, issuing a second command to delete the plurality of sets of encoded data slices.

5. The method of claim 1, wherein the analysis priority protocol comprises one or more of:
   a time based scaling factor;
   a data source based scaling factor;
   a data content based scaling factor; and
   a data location origination based scaling factor, wherein the analysis priority protocol is a function of the scaling factors.

6. The method of claim 1 further comprises:
   determining a data characterization of the data, wherein the data characterization includes at least one of a time factor, a data source factor, a data content factor, and a data location origination factor;
   determining a priority level of the data based on the data characterization and the analysis priority protocol; and
   selecting parameters for the dispersed storage error coding function based on the priority level.

7. The method of claim 1 further comprises:
   when the analysis priority of the data compares unfavorably to the first priority threshold:
      issuing a no-rebuilding command regarding the encoded data slices from each set of the at least some of the plurality of sets of encoded data slices; and
      updating parameters of the dispersed storage error coding function to reflect the deletion of encoded data slices from each set of the at least some of the plurality of sets of encoded data slices.

8. A dispersed storage (DS) processing module comprises:
   a first module, when operable within a computing device, causes the computing device to:
      monitor storage of data, wherein the data is encoded using a dispersed storage error coding function to produce a plurality of sets of encoded data slices and is stored as the plurality of sets of encoded data slices;
   a second module, when operable within the computing device, causes the computing device to:
      determine analysis priority of the data in accordance with an analysis prioritization protocol; and
   a third module, when operable within the computing device, causes the computing device to:
      when the analysis priority of the data compares unfavorably to a first priority threshold, issue a command to delete an encoded data slice from each set of at least some of the plurality of sets of encoded data slices.

9. The DS processing module of claim 8, wherein the third module is further operable to:
   when the analysis priority of the data compares unfavorably to a second priority threshold, issue a second command to delete the encoded data slice and at least one other encoded data slice from each set of the at least some of the plurality of sets of encoded data slices.

10. The DS processing module of claim 8, wherein the third module is further operable to:
   determine, in accordance with the analysis prioritization protocol, that analysis of the data is no longer desired; and
   when the analysis of the data is no longer desired, issue a second command to delete the plurality of sets of encoded data slices.

11. The DS processing module of claim 8 further comprises:
   a fourth module, when operable within the computing device, causes the computing device to:
      analyze the data; and
   the third module, when operable within the computing device, further causes the computing device to:
      determine, based on the analyzing the data, whether the data can be deleted; and
      when the data can be deleted, issue a second command to delete the plurality of sets of encoded data slices.

12. The DS processing module of claim 8, wherein the analysis priority protocol comprises at least one of:
   a time based scaling factor;
   a data source based scaling factor;
   a data content based scaling factor; and
   a data location origination based scaling factor, wherein the analysis priority protocol is a function of the scaling factors.

13. The DS processing module of claim 8, wherein the first module is further operable to:
   determine a data characterization of the data, wherein the data characterization includes at least one of a time factor, a data source factor, a data content factor, and a data location origination factor;

determine a priority level of the data based on the data characterization and the analysis priority protocol; and select parameters for the dispersed storage error coding function based on the priority level.

14. The DS processing module of claim 8, wherein the third module is further operable to:

when the analysis priority of the data compares unfavorably to the first priority threshold:

issue a no-rebuilding command regarding the encoded data slices from each set of the at least some of the plurality of sets of encoded data slices; and update parameters of the dispersed storage error coding function to reflect the deletion of encoded data slices from each set of the at least some of the plurality of sets of encoded data slices.

* * * * *